(12) United States Patent
Liu et al.

(10) Patent No.: US 10,446,750 B2
(45) Date of Patent: Oct. 15, 2019

(54) APPARATUSES INCLUDING MEMORY DEVICES AND RELATED ELECTRONIC SYSTEMS

(71) Applicant: Ovonyx Memory Technology, LLC, Alexandria, VA (US)

(72) Inventors: Jun Liu, Boise, ID (US); Michael P. Violette, Boise, ID (US)

(73) Assignee: Ovonyx Memory Technology, LLC, Alexandria, VA (US)

( * ) Notice: Subject to any disclaimer, the term of this patent is extended or adjusted under 35 U.S.C. 154(b) by 0 days.

(21) Appl. No.: 16/196,681

(22) Filed: Nov. 20, 2018

(65) Prior Publication Data

US 2019/0173007 A1    Jun. 6, 2019

Related U.S. Application Data

(60) Continuation of application No. 15/869,397, filed on Jan. 12, 2018, now Pat. No. 10,164,186, which is a
(Continued)

(51) Int. Cl.
*H01L 45/00* (2006.01)
*H01L 27/24* (2006.01)

(52) U.S. Cl.
CPC ...... *H01L 45/1273* (2013.01); *H01L 27/2409* (2013.01); *H01L 27/2463* (2013.01);
(Continued)

(58) Field of Classification Search
CPC ....... H01L 21/02; H01L 21/441; H01L 45/00; H01L 45/16; H01L 45/065; H01L 45/1273; H01L 45/1233; H01L 45/1253; H01L 45/141; H01L 45/04; H01L 45/06; H01L 45/126; H01L 45/142; H01L 45/143; H01L 45/144; H01L 45/146; H01L 45/147; H01L 45/148; H01L 45/1675
(Continued)

(56) References Cited

U.S. PATENT DOCUMENTS 5,296,716 A    3/1994 Ovshinsky et al.
6,150,253 A   11/2000 Doan et al.
(Continued)

FOREIGN PATENT DOCUMENTS

EP    1473767 A2    11/2004
JP    2005-534515   11/2005
(Continued)

OTHER PUBLICATIONS

Zhong et al., "Synthesis of p-Type Gallium Nitride Nanowires for Electronic and Photonic Nanodevices," Nano Letters, 2003, vol. 3, No. 3, pp. 343-346.
(Continued)

*Primary Examiner* — Chuong A Luu
(74) *Attorney, Agent, or Firm* — TraskBritt

(57) ABSTRACT

Memory devices having memory cells comprising variable resistance material include an electrode comprising a single nanowire. Various methods may be used to form such memory devices, and such methods may comprise establishing contact between one end of a single nanowire and a volume of variable resistance material in a memory cell. Electronic systems include such memory devices.

20 Claims, 17 Drawing Sheets

Related U.S. Application Data continuation of application No. 15/383,105, filed on Dec. 19, 2016, now Pat. No. 9,871,196, which is a division of application No. 14/537,670, filed on Nov. 10, 2014, now Pat. No. 9,525,131, which is a continuation of application No. 12/960,123, filed on Dec. 3, 2010, now Pat. No. 8,883,602, which is a division of application No. 11/784,315, filed on Apr. 5, 2007, now Pat. No. 7,859,036.

(52) U.S. Cl.
CPC ............. *H01L 45/04* (2013.01); *H01L 45/06* (2013.01); *H01L 45/065* (2013.01); *H01L 45/126* (2013.01); *H01L 45/1233* (2013.01); *H01L 45/1253* (2013.01); *H01L 45/144* (2013.01); *H01L 45/146* (2013.01); *H01L 45/147* (2013.01); *H01L 45/16* (2013.01); *H01L 45/1675* (2013.01)

(58) Field of Classification Search
USPC ........................................................ 438/382
See application file for complete search history.

(56) References Cited

U.S. PATENT DOCUMENTS

| | | |
|---|---|---|
| 6,294,452 B1 | 9/2001 | Doan et al. |
| 6,329,666 B1 | 12/2001 | Doan et al. |
| 6,423,621 B2 | 7/2002 | Doan et al. |
| 6,781,145 B2 | 8/2004 | Doan et al. |
| 6,897,467 B2 | 5/2005 | Doan et al. |
| 6,995,649 B2 | 2/2006 | Nugent |
| 7,005,665 B2 | 2/2006 | Furkay et al. |
| 7,019,391 B2 | 3/2006 | Tran |
| 7,030,640 B2 | 4/2006 | Yee et al. |
| 7,042,760 B2 | 5/2006 | Hwang et al. |
| 7,050,328 B2 | 5/2006 | Khouri et al. |
| 7,057,923 B2 | 6/2006 | Furkay et al. |
| 7,105,428 B2 | 9/2006 | Pan et al. |
| 7,130,214 B2 | 10/2006 | Lee |
| 7,420,199 B2 | 9/2008 | Gutsche et al. |
| 7,800,933 B2 | 9/2010 | Kumar et al. |
| 7,859,036 B2 | 12/2010 | Liu et al. |
| 8,883,602 B2 | 11/2014 | Liu et al. |
| 2001/0007783 A1 | 7/2001 | Lee et al. |
| 2002/0005876 A1 | 1/2002 | Grimes et al. |
| 2003/0072885 A1 | 4/2003 | Lee et al. |
| 2003/0089899 A1 | 5/2003 | Lieber et al. |
| 2003/0111336 A1 | 6/2003 | Lee et al. |
| 2004/0016318 A1* | 1/2004 | Angeliu .................. C22C 1/02 75/332 |
| 2004/0026684 A1 | 2/2004 | Empedocles |
| 2004/0028812 A1 | 2/2004 | Wessels et al. |
| 2004/0077123 A1 | 4/2004 | Lee et al. |
| 2004/0082178 A1 | 4/2004 | Kamins et al. |
| 2004/0092050 A1 | 5/2004 | Shuy et al. |
| 2004/0145941 A1 | 7/2004 | Rust |
| 2004/0173378 A1 | 9/2004 | Zhou et al. |
| 2004/0246650 A1 | 12/2004 | Grigorov et al. |
| 2004/0251551 A1 | 12/2004 | Hideki |
| 2005/0018526 A1* | 1/2005 | Lee .......................... H01L 45/06 365/232 |
| 2005/0041464 A1 | 2/2005 | Cho et al. |
| 2005/0067936 A1 | 3/2005 | Lee et al. |
| 2005/0161659 A1 | 7/2005 | Bakkers |
| 2005/0162303 A1 | 7/2005 | Cho et al. |
| 2005/0176228 A1 | 8/2005 | Fonash et al. |
| 2005/0176264 A1 | 8/2005 | Lai et al. |
| 2005/0191774 A1 | 9/2005 | Li et al. |
| 2005/0223969 A1 | 10/2005 | Chen et al. |
| 2005/0266662 A1 | 12/2005 | Yi |
| 2006/0019472 A1 | 1/2006 | Pan et al. |
| 2006/0028886 A1 | 2/2006 | Choi et al. |
| 2006/0034116 A1 | 2/2006 | Lam et al. |
| 2006/0051401 A1 | 3/2006 | Manohar et al. |
| 2006/0054982 A1 | 3/2006 | Yang et al. |
| 2006/0086314 A1 | 4/2006 | Zhang et al. |
| 2006/0087876 A1 | 4/2006 | Cho et al. |
| 2006/0097145 A1 | 5/2006 | Joyce et al. |
| 2006/0097149 A1 | 5/2006 | Joyce |
| 2006/0131555 A1 | 6/2006 | Liu et al. |
| 2006/0131556 A1 | 6/2006 | Liu et al. |
| 2006/0134392 A1 | 6/2006 | Hantschel et al. |
| 2006/0134883 A1 | 6/2006 | Hantschel et al. |
| 2006/0138393 A1 | 6/2006 | Seo et al. |
| 2006/0152186 A1 | 7/2006 | Suh et al. |
| 2006/0180811 A1 | 8/2006 | Lee et al. |
| 2006/0220071 A1 | 10/2006 | Kang et al. |
| 2006/0240681 A1 | 10/2006 | Williams et al. |
| 2006/0246643 A1 | 11/2006 | Ohsawa |
| 2006/0249841 A1 | 11/2006 | Subramanian et al. |
| 2006/0255481 A1 | 11/2006 | Pan et al. |
| 2006/0257637 A1 | 11/2006 | Pereira et al. |
| 2006/0273389 A1 | 12/2006 | Cohen et al. |
| 2007/0003731 A1 | 1/2007 | Forbes et al. |
| 2007/0003732 A1 | 1/2007 | Forbes et al. |
| 2007/0007142 A1 | 1/2007 | Zhou et al. |
| 2007/0012956 A1 | 1/2007 | Gutsche et al. |
| 2007/0029600 A1 | 2/2007 | Cohen |
| 2007/0108068 A1 | 5/2007 | Suh et al. |
| 2008/0239791 A1 | 10/2008 | Tran |
| 2011/0076827 A1 | 3/2011 | Liu et al. |
| 2015/0060754 A1 | 3/2015 | Liu et al. |
| 2017/0104156 A1 | 4/2017 | Liu et al. |
| 2017/0213870 A1 | 7/2017 | Sim et al. |

FOREIGN PATENT DOCUMENTS

| | | |
|---|---|---|
| WO | 2004/012932 A1 | 2/2004 |
| WO | 2004/094690 A1 | 11/2004 |
| WO | 2006/003620 A1 | 1/2006 |

OTHER PUBLICATIONS

Yang et al., "Encoding Electronic Properties by Synthesis of Axial Modulation-Doped Silicon Nanowires," Science, vol. 310, Nov. 25, 2005, pp. 1304-1307.

Xia et al., "One-Dimensional Nanostructures: Synthesis, Characterization and Applications," 15 Advanced Materials 353-389 (Mar. 2003).

Wuttig, Matthias, "Towards a universal memory?" Nature Materials, vol. 4, Apr. 2005, pp. 265-266.

Watanabe et al., Current-driven insulator—conductor transition and nonvolatile memory in chromium-doped $SrTiO_3$ single crystals, Applied Physics Letters, vol. 78, No. 23, Jun. 4, 2001, pp. 3738-3740.

Varesi et al., "Advances in Phase Change Memory Technology," STMicroelectronics, Central R&D—Agrate, Italy, (2004), 8 pages.

Thum-Albrecht et al., "Ultrahigh-Density Nanowire Arrays Grown in Self-Assembled Diblock Copolymer Templates," Science, vol. 290, (Dec. 15, 2000), pp. 2126-2129.

Song et al., "Highly Reliable 256Mb PRAM with Advanced Ring Contact Technology and Novel Encapsulating Technology," 2006 Symposium on VLSI Technology, Digest of Technical Papers, (2006), 2 pages.

Search Report of the IPO, ROC (Taiwan) Application No. 097112371, dated Oct. 11, 2011, two (2) pages.

Rossel et al., "Electrical current distribution across a metal-insulator-metal structure during bistable switching," Journal of Applied Physics, vol. 90, No. 6, (Sep. 15, 2001), pp. 2892-2898.

Redaelli et al., "Comprehensive numerical model for Phase-Change Memory simulations," DEI, Politecnico di Milano, Italy, (Sep. 2005), pp. 279-282.

Pellizzer et al., "Novel .mu.Trench Phase-Change Memory Cell for Embedded and Stand-Alone Non-Volatile Memory Applications," 2004 Symposium on VLSI Technology, Digest of Technical Papers, (2004), pp. 18-19.

(56) References Cited

OTHER PUBLICATIONS

Office Action of the Taiwan Intellectual Property Office (IPO), ROC (Taiwan) Application No. 097112371, dated Oct. 11, 2011, 13 pages.
Lee et al., "Full Integration and Cell Characteristics for 64Mb Nonvolatile PRAM," 2004 Symposium on VLSI Technology, Digest of Technical Papers, (2004), pp. 20-21.
Lai, Stefan, "Current status of the phase change memory and its future," Intel Corporation, RN2-05, (2003), 4 pages.
Lai, et al., "OUM—A 180nm Nonvolatile Memory Cell Element Technology for Stand Alone and Embedded Applications," Intel Corporation RN3-01, IEDM 01-803, 2001, (Dec. 2001). pp. 36.5.1-36.5.4.
Lacaita, A.L., "Physics and Performance of Phase Change Memories," DEI—Politecnico di Milano & IU.Net., (Sep. 2005), pp. 267-270.
Lacaita, A.L., "Phase change memories: State-of-the-art, challenges and perspectives," Solid-State Electronics 50 (2006) pp. 24-31.
Kim et al., "Structural properties of Ge2Sb2Te5 thin films by metal organic chemical vapor deposition for phase change memory applications," Applied Physics Letters, 89, 102107 (2006) 3 pages.
Kim et al., "Simulation for Reset Operation of Ge2Sb2Te5 Phase-Change Random Access Memory," Japanese Journal of Applied Physics, vol. 44, No. 8, (2005), pp. 5943-5948.
International Written Opinion for International Application No. PCT/US2008/058485 dated Oct. 24, 2008, 5 pages.
International Search Report for International Application No. PCT/US2008/058485 dated Oct. 24, 2008, 5 pages.
International Preliminary Report on Patentability for International Application No. PCT/US2008/058485 dated Oct. 5, 2009, 5 pages.
Ielmini et al., "Analysis of Phase Distribution in Phase-Change Nonvolatile Memories," IEEE Electron Device Letters, vol. 25, No. 7, (Jul. 2004), pp. 507-509.
Hwang, Hyunsang, "Resistance Switching Characteristics of Metal Oxide and Schottky Junction for Nonvolatile Memory Applications," Gwangju Institute of Science & Technology, Korea, NVMTS, (2006), 35 pages.
Hwang et al., "Full Integration and Reliability Evaluation of Phase-change RAM Based on 0.24.mu.m-CMOS Technologies," 2003 Symposium on VLSI Technology, Digest of Technical Papers, (2003), pp. 173-174.
Hudgens et al., "Overview of Phase-Change Chalcogenide Nonvolatile Memory Technology," MRS Bulletin, (Nov. 2004), pp. 829-832.
Hsu et al., "RRAM Switching Mechanism," Sharp Laboratories of America and Texas Center for Superconductivity and Advanced Materials, (2005), 4 pages.
Ha et al., "An Edge Contact Type Cell for Phase Change RAM Featuring Very Low Power Consumption," 2003 Symposium on VLSI Technology, Digest of Technical Papers, (2003), pp. 175-176.
Cheng et al., "Role of Electric Field on Formation of Silicon Nanowires," J. Applied Physics, vol. 94, No. 2 (2003), pp. 1190-1194.
Bedeschi et al., "An 8Mb Demonstrator for High-Density 1.8V Phase-Change Memories," 2004 Symposium on VLS Circuits, Digest of Technical Papers, (2004), pp. 442-445.

* cited by examiner

APPARATUSES INCLUDING MEMORY DEVICES AND RELATED ELECTRONIC SYSTEMS

CROSS-REFERENCE TO RELATED APPLICATIONS

This application is a continuation of U.S. patent application Ser. No. 15/869,397, filed Jan. 12, 2018, now U.S. Pat. No. 10,164,186, issued Dec. 25, 2018, which is a continuation of U.S. patent application Ser. No. 15/383,105, filed Dec. 19, 2016, now U.S. Pat. No. 9,871,196, issued Jan. 16, 2018, which is a divisional of U.S. patent application Ser. No. 14/537,670, filed Nov. 10, 2014, now U.S. Pat. No. 9,525,131, issued Dec. 20, 2016, which is a continuation of U.S. patent application Ser. No. 12/960,123, filed Dec. 3, 2010, now U.S. Pat. No. 8,883,602, issued Nov. 11, 2014, which application is a divisional of U.S. patent application Ser. No. 11/784,315, filed Apr. 5, 2007, now U.S. Pat. No. 7,859,036, issued Dec. 28, 2010, the disclosure of each of which is hereby incorporated herein by this reference in its entirety.

TECHNICAL FIELD

The present invention relates to methods of forming small electrodes for use in memory cells of non-volatile memory devices including, for example, resistance memory devices and phase change memory devices, to memory devices formed by such methods, and to systems including such memory devices.

BACKGROUND

Various types of non-volatile memory devices employ materials that can be caused to selectively exhibit more than one value of electrical resistivity. To form a single memory cell (i.e., one bit), a volume of such a material may be provided between two electrodes. A selected voltage (or current) may be applied between the electrodes, and the resulting electrical current (or voltage) therebetween will be at least partially a function of the particular value of the electrical resistivity exhibited by the material between the electrodes. A relatively higher electrical resistivity may be used to represent a "1" in binary code, and a relatively low electrical resistivity may be used to represent a "0" in binary code, or vice versa. By selectively causing the material between the electrodes to exhibit relatively high and low values of electrical resistivity, the memory cell can be selectively characterized as exhibiting either a "1" or a "0" value.

One particular type of such non-volatile memory devices is the phase change memory device. In a phase change memory device, the materials provided between the electrodes typically are capable of exhibiting at least two microstructural phases or states, each of which exhibits a different value of electrical resistivity. For example, the so-called "phase change material" may be capable of existing in a crystalline phase (i.e., the atoms of the material exhibit relative long-range order) and an amorphous phase (i.e., the atoms of the material do not exhibit any or relatively little long-range order). Typically, the amorphous phase is formed by heating at least a portion of the phase change material to a temperature above the melting point thereof, and then rapidly quenching (i.e., cooling) the phase change material to cause the material to solidify before the atoms thereof can assume any long-range order. To transform the phase change material from the amorphous phase to a crystalline phase, the phase change material is typically heated to an elevated temperature below the melting point, but above a crystallization temperature, for a time sufficient to allow the atoms of the material to assume the relatively long-range order associated with the crystalline phase. For example, $Ge_2Sb_2Te_5$ (often referred to as "GST") is often used as a phase change material. This material has a melting point of about 620° C., and is capable of existing in amorphous and crystalline states. To form the amorphous (high resistivity) phase, at least a portion of the material is heated to a temperature above the melting point thereof by applying a relatively high current through the material between the electrodes (the heat being generated due to the electrical resistance of the phase change material) for as little as 10 to 100 nanoseconds. As the GST material quickly cools when the current is interrupted, the atoms of the GST do not have sufficient time to form an ordered crystalline state, and the amorphous phase of the GST material is formed. To form the crystalline (low resistivity) phase, at least a portion of the material may be heated to a temperature of about 550° C., which is above the crystallization temperature and near, but below, the melting point of the GST material, by applying a relatively lower current through the GST material between the electrodes for a sufficient amount of time (e.g., as little as about 30 nanoseconds) to allow the atoms of the GST material to assume the long-range order associated with the crystalline phase, after which the current flowing through the material may be interrupted. The current passed through the phase change material to cause a phase change therein may be referred to as the "programming current."

Various memory devices having memory cells comprising variable resistance material, as well as methods for forming such memory devices and using such memory devices are known in the art. For example, memory cells comprising variable resistance materials and methods of forming such memory cells are disclosed in U.S. Pat. No. 6,150,253 to Doan et al., U.S. Pat. No. 6,294,452, United States Patent Applicant Publication No. 2006/0034116 A1 to Lam et al., U.S. Pat. No. 7,057,923 to Furkay et al., United States Patent Applicant Publication No. 2006/0138393 A1 to Seo et al., and United States Patent Applicant Publication No. 2006/0152186 A1 to Suh et al., the disclosure of each of which is incorporated herein in its entirety by this reference. Furthermore, supporting circuitry that may be used to form a memory device comprising memory cells having a variable resistance material, as well as methods of operating such memory devices, are disclosed in, for example, United States Patent Applicant Publication No. 2005/0041464 A1 to Cho et al., U.S. Pat. No. 7,050,328 to Khouri et al., and U.S. Pat. No. 7,130,214 to Lee, the disclosure of each of which is also incorporated herein in its entirety by this reference.

As previously mentioned, the heat generated in a finite volume of the phase change material, as the programming current is passed through the volume of material, is due to the electrical resistance of the material. Furthermore, the amount of heat generated in the finite volume of the phase change material is at least partially a function of the current density in the finite volume of phase change material. For a given current passing through a phase change material between two electrodes, the current density in the phase change material is at least partially a function of the size (e.g., cross-sectional area) of the smallest electrode. As a result, it is desirable to decrease the size of at least one of the electrodes such that the current density in the phase change material is increased, and the programming current required to cause a phase change in the phase change material is reduced. By decreasing the required programming current, the energy required to operate the memory device may be decreased. Therefore, there is a need for methods that can be used to form variable resistance memory devices having relatively smaller electrodes than those presently known in the art.

DETAILED DESCRIPTION

Figure 1A:
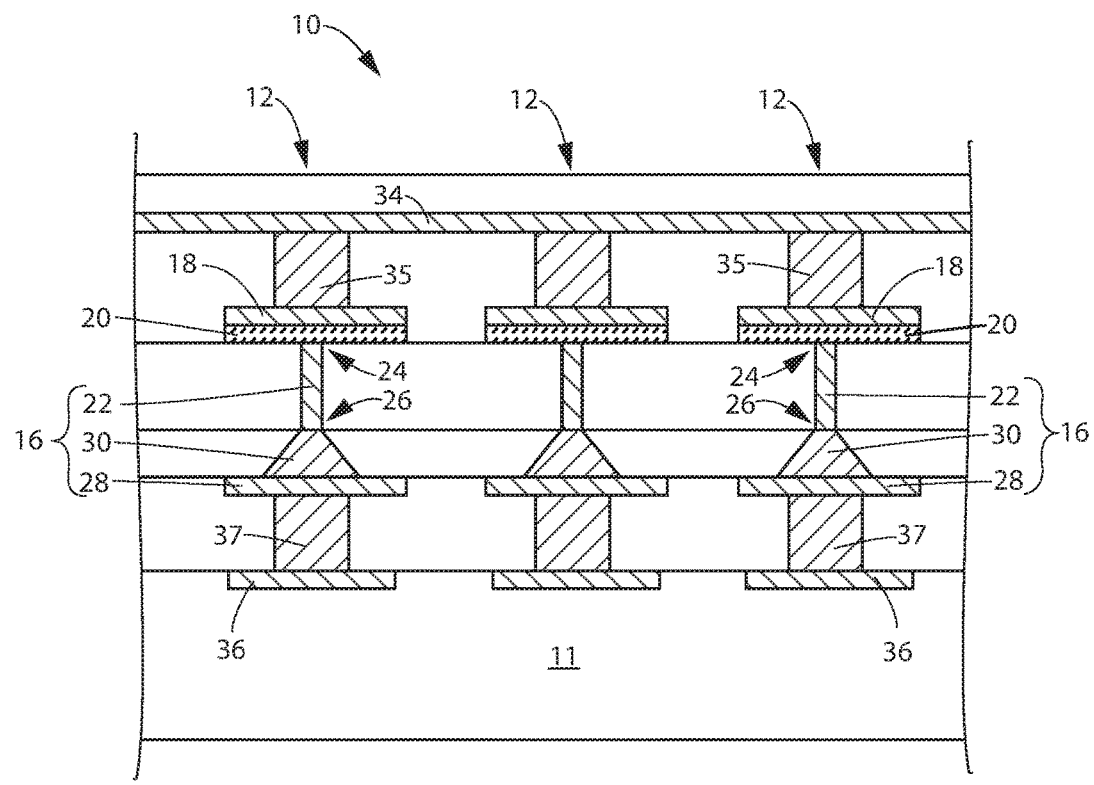
FIG. 1A is a partial cross-sectional schematic view of an embodiment of a memory device of the present invention illustrating three memory cells therein.

As discussed in further below, in some embodiments, the present invention comprises memory devices having a volume of variable resistance material disposed between two electrodes. At least one of the electrodes is or includes a single nanowire having one end in electrical contact with the volume of variable resistance material and a second end in electrical contact with other conductive features or elements of the memory device. In additional embodiments, the present invention comprises electronic systems that include one or more such memory devices. The one or more such memory devices may be in electrical communication with an electronic signal processor. In other embodiments, the present invention includes methods of forming such memory devices. Such methods may include providing contact between one end of a single nanowire and a volume of variable resistance material.

As used herein, the term "variable resistance material" means any material capable of exhibiting more than one value of electrical resistivity, and hence, conductivity. Variable resistance materials may include, for example, phase change materials (e.g., chalcogenides such as, for example $Ge_2Sb_2Te_5$, $Te_{81}Ge_{15}Sb_2S_2$, and $Sb_2Te_3$), colossal magnet resistive films (e.g., $Pr_{(1-x)}Ca_xMnO_3$ (PCMO), $La_{(1-x)}Ca_x$-$MnO_3$ (LCMO), and $Ba_{(1-x)}Sr_xTiO_3$), oxide materials (e.g., doped or undoped binary or ternary oxides such as, for example, $Al_2O_3$, $BaTiO_3$, $SrTiO_3$, $Nb_2O_5$, $SrZrO_3$, $TiO_2$, $Ta_2O_5$, $NiO$, $ZrO_x$, $HfO_x$, and $Cu_2O$), which may have a Perovskite structure, and materials having the general formula $A_xB_y$, where B is selected from sulfur (S), selenium (Se), and tellurium (Te), and mixtures thereof, and where A includes at least one element from Group III-B (B, Al, Ga, In, Tl), Group IV-B (C, Si, Ge, Sn, Pb), Group V-B (N, P, As, Sb, Bi), or Group VII-B (F, Cl, Br, I, At) with one or more dopants selected from noble metal and transition metal elements such as, for example, Au, Ag, Pt, Cu, Cd, In, Ru, Co, Cr, Ni, Mn, and Mo.

As used herein, the term "nanowire" means any elongated structure having transverse cross-sectional dimensions averaging less than about 50 nanometers.

As used herein, the term "superlattice structure" means a structure predominantly comprised of periodically alternating layers of different materials.

As used herein, the term "III-V type semiconductor material" means any material predominantly comprised of one or more elements from Group III-B of the periodic table (B, Al, Ga, In, and Ti) and one or more elements from Group V-B of the periodic table (N, P, As, Sb, and Bi).

As used herein, the term "II-VI type semiconductor material" means any material predominantly comprised of one or more elements from Group II-B of the periodic table (Zn, Cd, and Hg) and one or more elements from Group VI-B of the periodic table (O, S, Se, Te, and Po).

As used herein, the term "wafer" means any structure that includes a layer of semiconductor type material including, for example, silicon, germanium, gallium arsenide, indium phosphide, and other III-V or II-VI type semiconductor materials. Wafers include, for example, not only conventional wafers but also other bulk semiconductor substrates such as, by way of non-limiting example, silicon-on-insulator (SOI) type substrates, silicon-on-sapphire (SOS) type substrates, and epitaxial layers of silicon supported by a layer of base material. Semiconductor type materials may be doped or undoped. Furthermore, when reference is made to a "wafer" in the following description, previous process steps may have been utilized to at least partially form elements or components of a circuit or device in or over a surface of the wafer.

The illustrations presented herein are not meant to be actual views of any particular memory device, memory cell, workpiece, or system, but are merely idealized representations that are employed to describe the present invention. Additionally, elements common between figures may retain the same numerical designation.

FIG. 1A is a partial cross-sectional schematic view of an embodiment of a memory device 10 of the present invention. The memory device 10 may include an integrated circuit comprising a plurality of memory cells 12, and the memory cells 12 may be arranged in an array on or in a substrate 11. By way of example and not limitation, the memory cells 12 may be arranged in a plurality of rows and columns. FIG. 1A is a partial cross-sectional view taken vertically through the substrate 11 and illustrates three memory cells 12 in a common row or column of the array of memory cells 12.

To facilitate illustration, the memory cells 12 are shown in FIG. 1A as occupying a major vertical portion of the substrate 11. It is understood, however, that in actuality, the substrate 11 may be relatively thicker than illustrated, and the memory cells 12 may occupy a relatively thinner portion of the substrate 11. Furthermore, only active elements of the memory cells 12 (i.e., the elements of the memory cells 12 through which charge carriers travel), or materials used to form such active elements, are cross-hatched to simplify the cross-sectional figures herein.

The substrate 11 may comprise, for example, a material such as glass or sapphire, or the substrate may comprise a full or partial wafer, which may facilitate processing using conventional semiconductor fabrication processes.

As shown in FIG. 1A, each memory cell 12 may comprise a first electrode 16, a second electrode 18, and a volume of variable resistance material 20 disposed between the first electrode 16 and the second electrode 18.

In some embodiments, the variable resistance material 20 may comprise a phase change material. For example, the variable resistance material 20 may comprise a phase change material such as a chalcogenide material. Typical chalcogenide materials are alloys predominantly comprising tellurium (Te), germanium (Ge), and antimony (Sb) and include, for example, $Ge_2Sb_2Te_5$, $Te_{81}Ge_{15}Sb_2S_2$, and $Sb_2Te_3$. Chalcogenide materials may be characterized by the general chemical formula $Te_aGe_bSb_{100-(a+b)}$, where "a" is less than about eighty-five (85) and "b" is above about eight (8).

In additional embodiments, the variable resistance material 20 may comprise one of various materials used to form so-called "colossal magnetoresistive films" such as, for example, $Pr_{(1-x)}Ca_xMnO_3$ (PCMO), $La_{(1-x)}Ca_xMnO_3$ (LCMO), and $Ba_{(1-x)}Sr_xTiO_3$. In yet other embodiments, the variable resistance material 20 may comprise a binary or ternary doped or undoped oxide material such as, for example, $Al_2O_3$, $BaTiO_3$, $SrTiO_3$, $Nb_2O_5$, $SrZrO_3$, $TiO_2$, $Ta_2O_5$, NiO, $ZrO_x$, $HfO_x$, and $Cu_2O$. Furthermore, the variable resistance material 20 may have a Perovskite structure. Yet another type of variable resistance material includes a doped chalcogenide glass of the general formula $A_xB_y$, where B is selected from sulfur (S), selenium (Se), and tellurium (Te), and mixtures thereof, and where A includes at least one element from Group III-B (B, Al, Ga, In, Tl), Group IV-B (C, Si, Ge, Sn, Pb), Group V-B (N, P, As, Sb, Bi), or Group VII-B (F, Cl, Br, I, At) with one or more dopants selected from noble metal and transition metal elements such as, for example, Au, Ag, Pt, Cu, Cd, In, Ru, Co, Cr, Ni, Mn, and Mo.

The first electrode 16 of each memory cell 12 may comprise a single nanowire 22 having a first end 24 proximate to or in direct physical contact with a surface of the volume of variable resistance material 20 and a second end 26 structurally and electrically coupled to other conductive features of the memory device 10. For example, the first electrode 16 of each memory cell 12 may further comprise a conductive pad 28, and the second end 26 of the single nanowire 22 may be structurally and electrically coupled to the conductive pad 28. In some embodiments, each conductive pad 28 may comprise a discrete, laterally isolated volume of conductive material, as shown in FIG. 1A. In other embodiments, each conductive pad 28 may simply comprise an area or region of an elongated laterally extending conductive trace.

By way of example and not limitation, the single nanowire 22 of each memory cell 12 may comprise a nanotube, such as a single wall carbon nanotube (SWCNT) or a multi-walled carbon nanotube (MWCNT). In additional embodiments, each nanowire 22 may comprise a substantially solid nanowire substantially comprised of a semiconductor material such as, for example, silicon, germanium, gallium, a III-V type semiconductor material, or a II-VI type semiconductor material. Such nanowires 22 optionally may have an integrated PN junction or a superlattice structure. Furthermore, each nanowire 22 may comprise a single crystal. In yet other embodiments, each nanowire 22 may comprise a substantially solid nanowire substantially comprised of a metal such as, for example, cobalt, copper, gold, nickel, platinum, or silver. Any type of nanowire 22 may be used as long as the nanowire exhibits sufficient electrical conductivity and can be formed, grown, placed, or otherwise provided within the memory cells 12, as discussed in further detail below.

With continued reference to FIG. 1A, the second end 26 of each nanowire 22 may be indirectly structurally and electrically coupled with the conductive pad 28 by way of a conductive catalytic structure 30. In other words, a conductive catalytic structure 30 may be disposed between the second end 26 of each nanowire 22 and the conductive pad 28, and the conductive catalytic structure 30 may be structurally and electrically coupled to both the nanowire 22 and the conductive pad 28. The conductive catalytic structures 30 may be used to catalyze the formation of the single nanowire 22 of each memory cell 12, as discussed in further detail below.

In some embodiments, each nanowire 22 may be grown or otherwise formed in situ, while in other embodiments, each nanowire 22 may be grown or formed elsewhere and subsequently positioned within a memory cell 12, as discussed in further detail below.

In some embodiments, each nanowire 22 may have an average diameter of less than about ten nanometers (10 nm). More particularly, each nanowire may have an average diameter of between about three nanometers (3 nm) and about six nanometers (6 nm) in some embodiments. Even more particularly, each nanowire may have an average diameter of between about four nanometers (4 nm) and about five nanometers (5 nm) in some embodiments.

The average thickness of the volume of variable resistance material 20 between the first end 24 of each nanowire 22 and the second electrode 18 may be between about one and about three times the average diameter of each nanowire 22. In some embodiments, the average thickness of each volume of variable resistance material 20 between the first end 24 of each nanowire 22 and the second electrode 18 may be about twice the average diameter of each nanowire 22.

The second electrode 18 of each memory cell 12 may be substantially similar to the conductive pads 28 of the first electrodes 16 and may comprise a discrete, laterally isolated volume of conductive material such as a metal. In other embodiments, each second electrode 18 may simply comprise an area or region of an elongated laterally extending conductive trace.

In some embodiments, each second electrode 18 may communicate electrically with a conductive line 34 by way of electrical contacts 35, and each first electrode 16 also may communicate electrically with another conductive line 36 by way of electrical contacts 37. In additional embodiments, the second electrodes 18 may simply comprise a region or portion of a conductive line, and the memory cells 12 need not include a separate conductive line 34 and electrical contacts 35. Similarly, in additional embodiments, the conductive pads 28 of the first electrodes 16 also may comprise a region or portion of a conductive line, and the memory cells 12 need not include a separate conductive line 36 and electrical contacts 37.

Furthermore, in additional embodiments, the first electrode 16 and the second electrode 18 may not each electrically communicate with a conductive line, and one or both of the first electrode 16 and the second electrode 18 may simply communicate with a conductive pad.

Although not shown in FIG. 1A, each memory cell 12 also may include an access transistor for selectively accessing the same for read and write operations, as known in the art.

A manner in which the memory cell 12 may be used or characterized so as to represent either a "0" or a "1" in binary code is briefly described below with reference to FIGS. 1B and 1C.

Figure 1B:
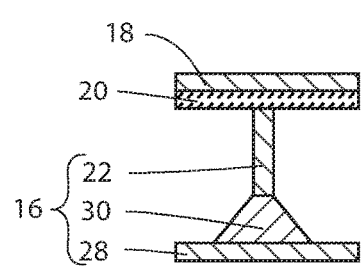
FIGS. 1B and 1C show the electrodes and variable resistance material of one memory cell shown in FIG. 1A and are used to illustrate one manner of operation thereof.
Figure 1C:
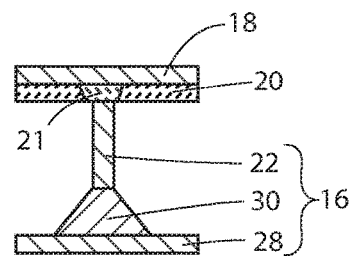

FIG. 1B is an enlarged view of the first electrode 16, second electrode 18, and variable resistance material 20 of one memory cell 12 shown in FIG. 1A. As previously discussed, the variable resistance material 20 may comprise a phase change material. The variable resistance material 20 of the memory cell 12 shown in FIG. 1B may exist in a first state or phase (i.e., the atoms may be disposed in a particular microstructure), which can be detected by providing a relatively low voltage between the first electrode 16 and the second electrode 18 and measuring the magnitude (e.g., amps) of the resulting current passing between the first electrode 16 and the second electrode 18 through the variable resistance material 20. By way of example and not limitation, this first state or phase (and, hence, the current magnitude) may be selected to represent a "1" in binary code.

To change the state or phase of the variable resistance material 20, a relatively high voltage may be provided between the first electrode 16 and the second electrode 18 to induce a relatively high current through the variable resistance material 20. This relatively high current flowing through the variable resistance material 20 may be referred to as the programming current and is used to heat at least a small portion 21 of the volume of variable resistance material 20 to a sufficient temperature to cause a change in the state or phase of the portion 21 of the variable resistance material 20, as shown in FIG. 1C. The portion 21 of the variable resistance material 20 then may exhibit an electrical resistivity (and, inversely, a conductivity) in the second state or phase that differs from the electrical resistivity in the first state or phase. As a result, the second state or phase can be detected by again providing a relatively low voltage between the first electrode 16 and the second electrode 18 and measuring the magnitude (e.g., amps) of the resulting current passing between the first electrode 16 and the second electrode 18, which will be different from the magnitude of the measured current when the variable resistance material 20 is in the first state or phase. By way of example and not limitation, this second state or phase (and, hence, the second current magnitude) may be selected to represent a "0" in binary code.

The heat generated in the portion 21 of the variable resistance material 20 as the programming current is passed therethrough is due to the electrical resistance of the variable resistance material 20. Furthermore, the amount of heat generated in the portion 21 of the variable resistance material 20 is at least partially a function of the current density in the portion 21 of the variable resistance material 20. For a given current passing through the variable resistance material 20 between the first electrode 16 and the second electrode 18, the current density in the variable resistance material 20 is at least partially a function of the size of the smaller of the first and second electrodes 16, 18. By using the first end 24 of a single nanowire 22 as the portion of the first electrode 16, which is immediately adjacent to the volume of variable resistance material 20, the current density in the portion 21 of the variable resistance material 20 is increased, and the programming current required to cause a phase change in the portion 21 of the variable resistance material 20 is reduced. By decreasing the required programming current, the energy required to operate the memory device 10 may be decreased. As a result, memory devices 10 of the present invention may be operated using less power relative to memory devices presently known in the art, they may be operated at higher speeds relative to memory devices presently known in the art, or may offer both such advantages.

Various methods for forming embodiments of memory devices according to the present invention, such as the memory device 10 shown in FIG. 1A, are described below. To facilitate description, the methods are described with reference to a single memory cell 12. In practice, however, a plurality of memory cells 12 may be formed substantially simultaneously on a substrate 11, and the memory cells 12 may comprise memory cells 12 of one or a plurality of memory devices 10.

Figure 2A:
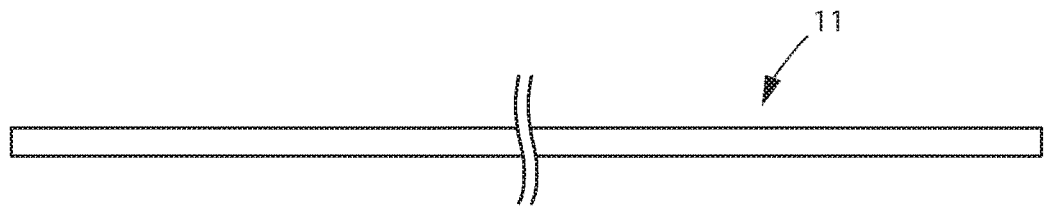
FIGS. 2A-2I are partial cross-sectional side views of a workpiece and illustrate a first embodiment of a method of the present invention that may be used to form a memory device like that shown in FIG. 1A and that includes using a shadow mask deposition process to form a catalytic structure.
Figure 2B:
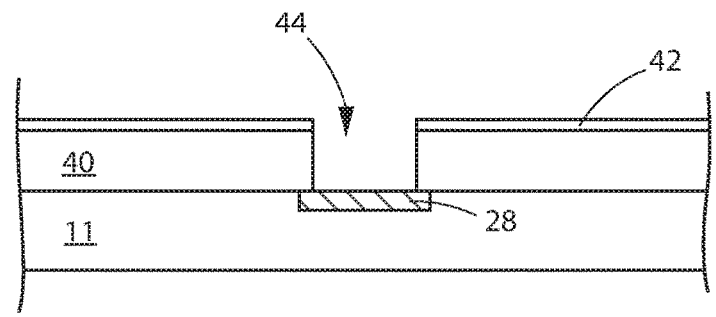

A first embodiment of a method that may be used to form the memory device 10 shown in FIG. 1A is described with reference to FIGS. 2A-2I. Referring to FIG. 2A, a substrate 11 may be provided, which, as previously discussed, may comprise a full or partial wafer of semiconductor material or a material such as glass or sapphire. A plurality of conductive pads 28 may be formed on or in a surface of the substrate 11 to form a workpiece, as shown in FIG. 2B. The conductive pads 28 may comprise, for example, a conductive metal such as tungsten or titanium nitride, and may be formed using, for example, metal layer deposition techniques (e.g., chemical vapor deposition (CVD), physical vapor deposition (PVD), sputtering, thermal evaporation, or plating) and patterning techniques (e.g., masking and etching) known in the art of integrated circuit fabrication. Additional features, such as, for example, the conductive lines 36 (which may simply comprise conductive pads in additional embodiments) and electrical contacts 37 (FIG. 1A) also may be formed on or in the surface of the substrate 11 in a similar manner (prior and/or subsequent to forming the conductive pads 28), although such additional features are not illustrated in FIGS. 2A-2I to simplify the figures.

As shown in FIG. 2B, a layer of dielectric material 40 may be provided over the workpiece (i.e., an exposed major surface of the substrate 11 and the conductive pad 28), and a mask layer 42 may be provided over the layer of dielectric material 40. By way of example and not limitation, the layer of dielectric material 40 may comprise an oxide such as silica ($SiO_2$) or silicon nitride ($Si_3N_4$), and may be formed by chemical vapor deposition, by decomposing tetraethyl orthosilicate (TEOS), or by any other process known in the art of integrated circuit fabrication. The mask layer 42 may comprise, for example, a layer of photoresist material or a layer of metal material. An aperture or via 44 then may be formed by patterning the mask layer 42 to form an opening therein at the location at which it is desired to form the via 44, and etching the layer of dielectric material 40 through the aperture in the mask layer 42 using, for example, an anisotropic reactive ion (i.e., plasma) etching process, to expose the underlying conductive pad 28. The particular composition of the gases used to generate the reactive ions and the operating parameters of the etching process may be selected based on the composition of the layer of dielectric material 40, the mask layer 42, and the conductive pad 28.

Figure 2C:
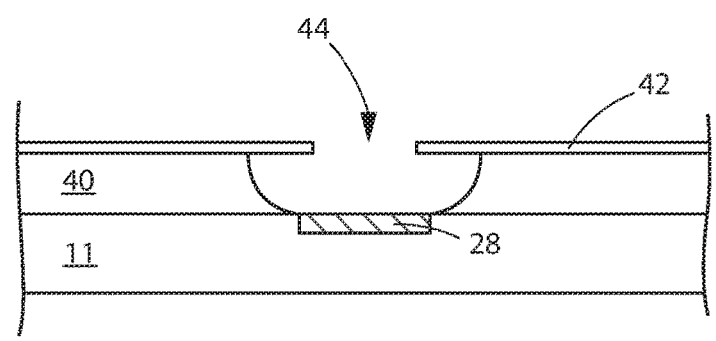

Referring to FIG. 2C, after forming the via 44 over the underlying conductive pad 28, another etchant that selectively etches away the layer of dielectric material 40 at a faster rate than the mask layer 42 and the conductive pad 28 may be used to etch away the exposed surfaces of the layer of dielectric material 40 within the via 44, so as to undercut the via 44. By way of example and not limitation, an isotropic wet chemical etching process may be used to undercut the via 44. Again, the particular composition of the chemical etchant may be selected based on the composition of the layer of dielectric material 40, the mask layer 42, and the conductive pad 28.

In additional embodiments, the via 44 may be formed using a single isotropic wet chemical etching process instead of a separate anisotropic reactive ion etching process followed by an isotropic wet chemical etching process.

Figure 2D:
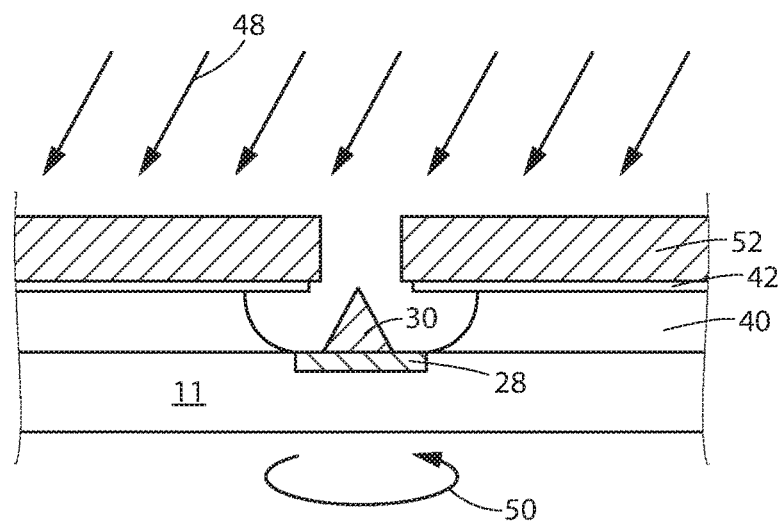

Referring to FIG. 2D, a shadow deposition process may be used to form a catalytic structure 30 on the conductive pad 28 within the via 44. Such processes are described in, for example, United States Patent Application Publication No. US 2006/0131556 A1, which was published Jun. 22, 2006 and entitled "Small Electrode For Resistance Variable Devices," the disclosure of which is incorporated herein in its entirety by this reference. For example, the substrate 11 may be provided in a deposition chamber (not shown), and a general directional flow of atoms of catalyst material may be generated therein using, for example, an evaporation process or a collimated sputtering process. The general directional flow of atoms of catalyst material is represented in FIG. 2D by the directional arrows 48. As shown, the workpiece (or substrate 11) may be oriented at an acute angle of less than ninety degrees (90°) relative to the general flow of atoms of catalyst material within the deposition chamber, and the workpiece may be rotated in the plane of the substrate 11, as indicated by the directional arrow 50, while the atoms of catalyst material are deposited thereon. By orienting the workpiece at an angle relative to the general direction of flow of atoms of catalyst material and rotating the substrate 11 as the catalyst material is deposited thereon, a generally conical catalytic structure 30 may be formed on the conductive pad 28 within the via 44. The base of the generally conical catalytic structure 30 may be structurally and electrically coupled to the conductive pad 28 as the catalytic structure 30 is formed thereon, and the tip of the generally conical catalytic structure 30 may have a cross-sectional area similar to, or less than, that of a desired average diameter of a nanowire 22 (FIG. 1A) to be formed, grown, or otherwise provided thereon. During the shadow deposition process, a layer of catalyst material 52 also may be deposited over the mask layer 42, as shown in FIG. 2D.

In additional embodiments, the workpiece (or substrate 11) may be oriented substantially perpendicular (i.e., at an angle of about ninety degrees (90°)) relative to the general flow of atoms of catalyst material within the deposition chamber.

Figure 2E:
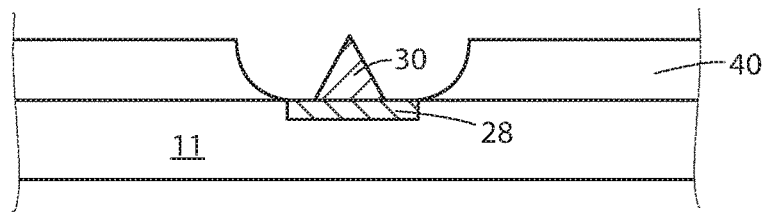

After forming the catalytic structure 30 on the conductive pad 28 within the via 44 (FIG. 2C), the layer of catalyst material 52 and the mask layer 42 may be removed using, for example, a chemical-mechanical polishing (CMP) process, a selective etching process, or a lift-off process to form the structure shown in FIG. 2E. For example, a lift-off layer (not shown) may be formed over the layer of dielectric material 40, after which the mask layer 42 may be deposited over the lift-off layer. The via 44 then may be formed through the mask layer 42, the lift-off layer, and the layer of dielectric material 40, and the catalytic structure 30 may be formed on the conductive pad 28, which may result in formation of the layer of catalyst material 52, as previously mentioned. The lift-off layer then may be stripped away from the workpiece, and the overlying mask layer 42 and layer of catalyst material 52 may be removed from the workpiece together with the underlying lift-off layer. In additional embodiments, the mask layer 42 itself may serve as a lift-off layer.

Figure 2F:
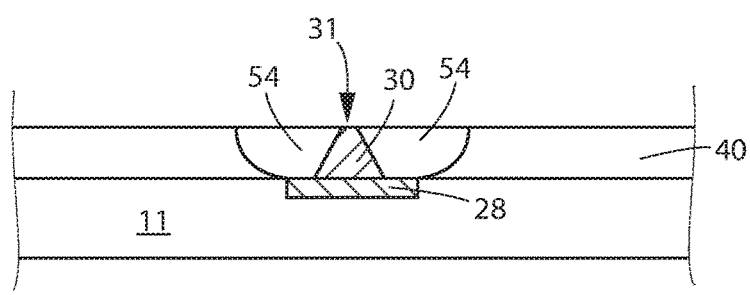

Referring to FIG. 2F, the remaining portion of the via 44 surrounding the catalytic structure 30 may be filled with a dielectric material 54, which, optionally, may be substantially identical to the dielectric material 40. By way of example and not limitation, a conformal layer (not shown) of dielectric material 54 may be deposited over the workpiece (or substrate 11) to a thickness sufficient to fill the remaining portion of the via 44 surrounding the catalytic structure 30. An additional chemical-mechanical polishing (CMP) process then may be used to planarize the surface of the workpiece and to expose the tip 31 of the catalytic structure 30 through the dielectric material 54, as shown in FIG. 2F. The chemical-mechanical polishing (CMP) process may be selectively terminated when the area of the surface of the tip 31 exposed through the dielectric material 54 by the chemical-mechanical polishing (CMP) process reaches a selected predetermined size. By way of example and not limitation, the chemical-mechanical polishing (CMP) process may be selectively terminated when the area of the exposed surface of the tip 31 has a cross-sectional area of less than about three hundred square nanometers (300 nm$^2$).

Figure 2G:
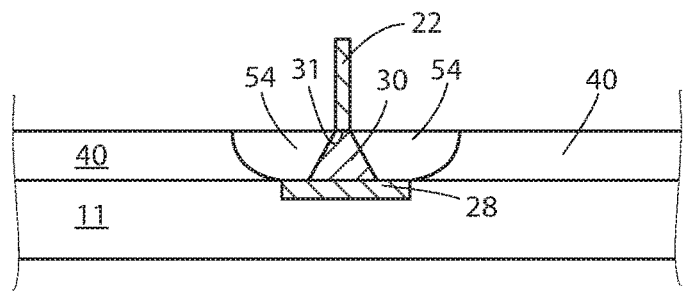

Referring to FIG. 2G, the tip 31 of the catalytic structure 30 then may be used to catalyze formation or growth of a single nanowire 22 thereon. Various methods of forming and/or growing nanowires using corresponding catalyst materials are known in the art and may be used to form the single nanowire 22. Some of such methods are described in, for example, Younan Xia et al., "One-Dimensional Nanostructures: Synthesis, Characterization and Applications," 15 *Advanced Materials* 353-389 (March 2003), the entire disclosure of which is incorporated herein in its entirety by this reference. By way of example and not limitation, chemical-vapor-deposition processes, which optionally may employ the so-called vapor-liquid-solid (VLS) mechanism, may be used to grow a nanowire 22 on the tip 31 of the catalytic structure 30, as known in the art. As one non-limiting example, the catalytic structure 30 may comprise gold, and the nanowire 22 may comprise a doped silicon (Si). Such a doped silicon nanowire may be formed using a chemical vapor deposition process and the vapor-liquid-solid (VLS) mechanism, as known in the art. As another non-limiting example, the catalytic structure 30 may comprise at least one of Ti, Co, Ni, Au, Ta, polysilicon, silicon-germanium, platinum, iridium, titanium nitride, or tantalum nitride, and the nanowire 22 may comprise iridium oxide (IrO$_x$), as described in United States Patent Publication No. 2006/0086314 A1 to Zhang et al., the entire disclosure of which is incorporated herein in its entirety by this reference. Furthermore, as previously discussed, the nanowire may comprise a III-V type semiconductor material or a II-V type semiconductor material. Various types of semiconductor materials that may be used to form nanowires, as well as the reactant precursor materials and catalyst materials, which may be used to catalyze formation of such nanowires, are disclosed in United States Patent Publication No. 2004/0028812 A1 to Wessels et al., the entire disclosure of which is also incorporated herein in its entirety by this reference.

In additional embodiments, the nanowire 22 may be fabricated elsewhere rather than in situ and positioned within the memory cell 12 using, for example, a selectively oriented electrical field. In such methods, the catalytic structure 30 may be replaced with an electrically conductive structure having a similar shape and configuration to the catalytic structure 30 but that does not comprise a catalyst material.

Figure 2H:
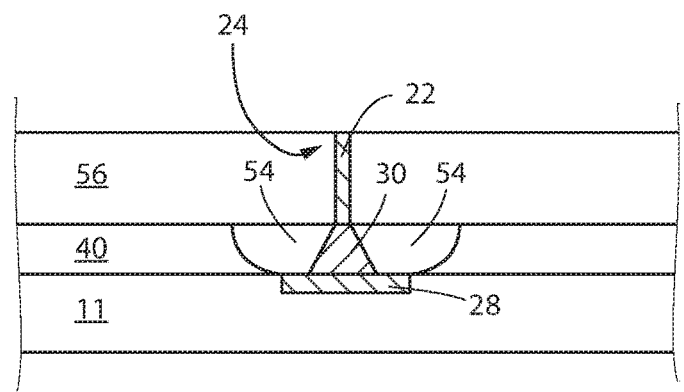
Figure 2I:
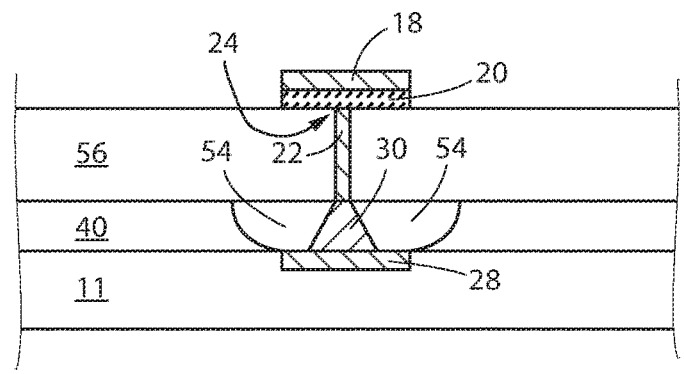

As shown in FIG. 2I, in some embodiments, the nanowire 22 may be oriented substantially perpendicular to the plane of the substrate 11. Various techniques for orienting nanowires 22 in a selected direction are known in the art and may be used to orient the nanowire 22 substantially perpendicular to the plane of the substrate 11. For example, an electrical field may be generated and selectively oriented to cause the nanowire 22 to selectively tailor the orientation of the nanowire 22 as the nanowire 22 is formed or grown on the catalytic structure 30 or otherwise positioned in the memory cell 12, as describe in, for example, Cheng et al., "Role of Electric Field on Formation of Silicon Nanowires," *J. Applied Physics*, Vol. 94, No. 2 (2003), the entire disclosure of which is incorporated herein in its entirety by this reference.

As shown in FIG. 2H, after using the tip 31 of the catalytic structure 30 to catalyze formation or growth of the single nanowire 22 thereon, another layer of dielectric material 56 may be provided around the single nanowire 22. By way of example and not limitation, the layer of dielectric material 56 may comprise a nitride material such as silicon nitride ($Si_3N_4$). In additional embodiments, the layer of dielectric material 56 may be substantially identical to the layer of dielectric material 40, and may comprise, for example, an oxide material. The layer of dielectric material 56 may be substantially conformal and may be deposited over the workpiece to a thickness sufficient to substantially cover the nanowire 22. The layer of dielectric material 56 may be planarized using a chemical-mechanical polishing (CMP) process to expose the first end 24 of the nanowire 22 through the dielectric material 56, as shown in FIG. 2H.

Referring to FIG. 2I, after exposing the first end 24 of the nanowire 22 through the dielectric material 56, a volume of variable resistance material 20 may be provided on the exposed surface of the layer of dielectric material 56 and over the first end 24 of the nanowire 22, and the second electrode 18 may be provided over the volume of variable resistance material 20. By way of example and not limitation, a layer of variable resistance material 20 may be deposited over the workpiece (or substrate 11), and a layer of metal for forming the second electrode 18 may be deposited on the layer of variable resistance material 20. A masking and etching process then may be used to selectively remove regions or areas of both the layer of metal material and the layer of dielectric material 56 leaving behind the volume of variable resistance material 20 over the nanowire 22 and the second electrode 18 over the volume of variable resistance material 20.

Additional features and elements, such as, for example, conductive lines 34 and electrical contacts 35 (FIG. 1A), then may be formed over the layer of variable resistance material 20 and the second electrode 18 as necessary or desired.

Figure 3A:
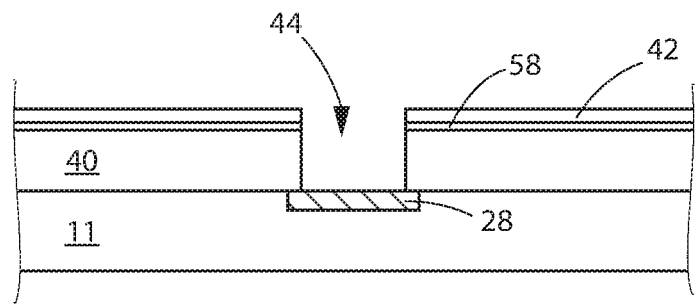
FIGS. 3A-3F are partial cross-sectional side views of a workpiece and illustrate a second embodiment of a method of the present invention that may be used to form a memory device like that shown in FIG. 1A.

A second embodiment of a method that may be used to form an embodiment of a memory device 10 is described below with reference to FIGS. 3A-3F. Referring to FIG. 3A, a workpiece may be provided that is substantially similar to the workpiece shown in FIG. 2B and includes the substrate 11, conductive pad 28, layer of dielectric material 40, and mask layer 42. The workpiece shown in FIG. 3A, however, also includes a polish-stop layer 58 disposed between the layer of dielectric material 40 and the mask layer 42. As a non-limiting example, the polish-stop layer 58 may comprise a layer of silicon nitride ($Si_3N_4$). To form the workpiece shown in FIG. 3A, the layer of dielectric material 40 may be deposited, followed by the polish-stop layer 58, and the mask layer 42. The polish-stop layer 58 may be deposited using, for example, a chemical vapor deposition (CVD) process. A via 44 may be formed through the layer of dielectric material 40, the polish-stop layer 58, and the mask layer 42 to expose the underlying conductive pad 28 using methods identical or substantially similar to those previously described in relation to FIG. 2B.

Figure 3B:
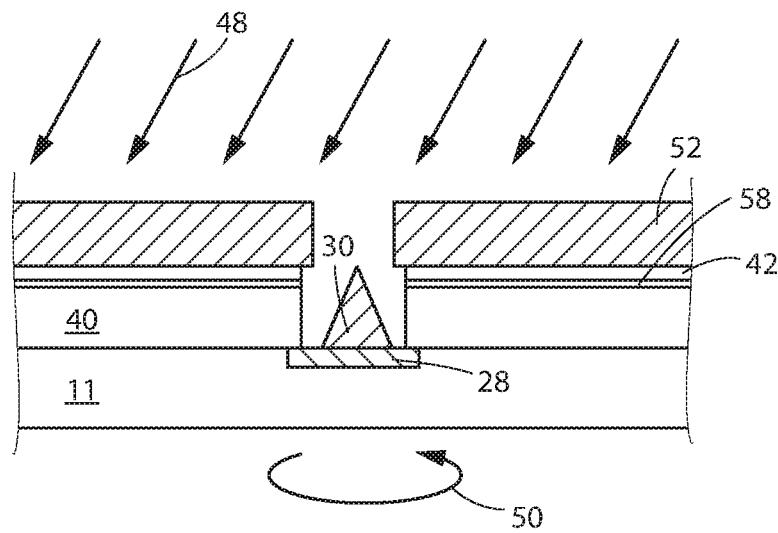
Figure 3C:
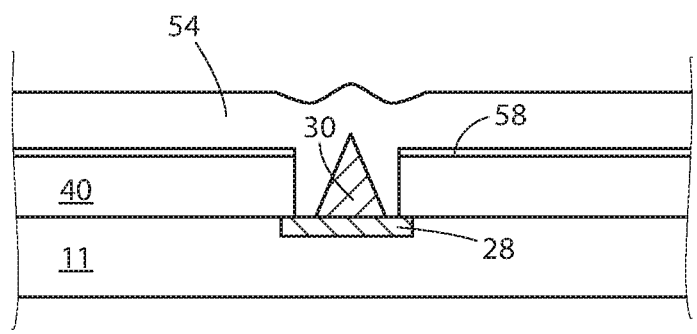
Figure 3D:
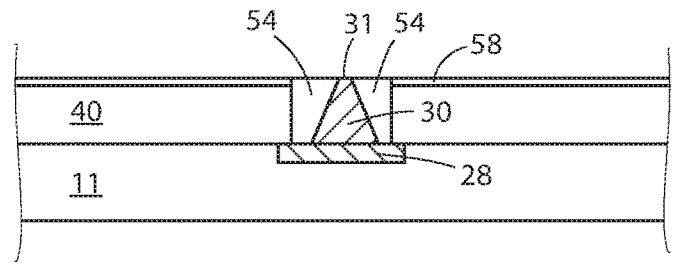

Referring to FIG. 3B, after forming the via 44, a catalytic structure 30 may be formed on the conductive pad 28 using a shadow deposition process as previously described in relation to FIG. 2D, after which the layer of catalyst material 52 and the mask layer 42 may be removed in the manner previously described in relation to FIG. 2E. A substantially conformal layer of dielectric material 54 then may be provided over the workpiece, as shown in FIG. 3C, to fill the regions of the via 44 surrounding the catalytic structure 30. As shown in FIG. 3D, a chemical-mechanical polishing (CMP) process then may be used to remove the portions of the layer of dielectric material 54 overlying the polish-stop layer 58. The slurry and polishing pad of the apparatus used to perform the chemical-mechanical polishing (CMP) process may be selectively tailored so as to wear away the layer of dielectric material 54 at a rate that is faster than the rate at which the process will wear away the underlying polish-stop layer 58. In this manner, substantially all of the layer of dielectric material 54 overlying the polish-stop layer 58 may be removed from the workpiece without completely removing the polish-stop layer 58. The polish-stop layer 58 may be used to ensure that only a selected amount of the tip 31 of the catalytic structure 30, if any at all, is removed from the catalytic structure 30 during the chemical-mechanical polishing (CMP) process.

Figure 3E:
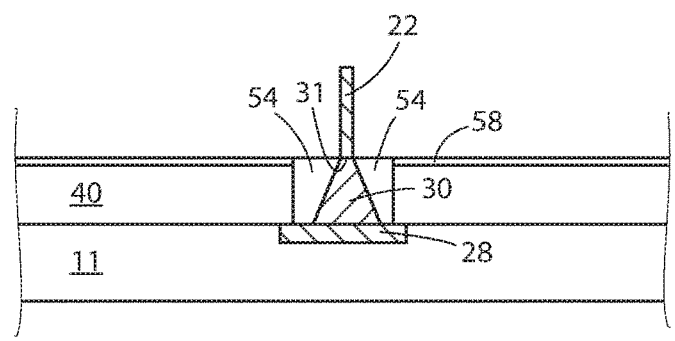
Figure 3F:
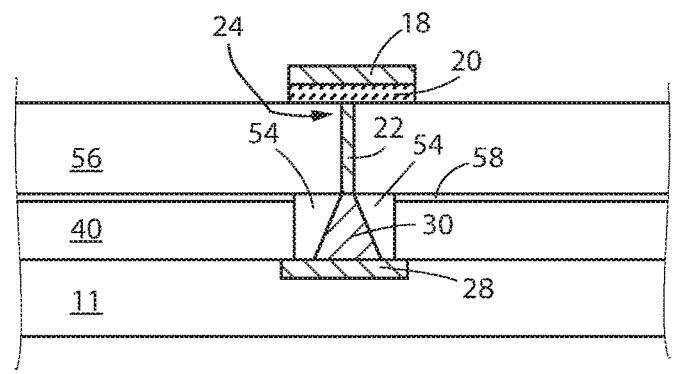

Referring to FIG. 3E, the tip 31 of the catalytic structure 30 then may be used to catalyze formation or growth of a single nanowire 22 thereon, as previously described in relation to FIG. 2G, after which a layer of dielectric material 56 may be provided around the nanowire 22, as shown in FIG. 3F. As previously discussed, a chemical-mechanical polishing (CMP) process may be used to planarize the layer of dielectric material 56 and expose the first end 24 of the nanowire 22 therethrough. The volume of variable resistance material 20 then may be provided over the first end 24 of the nanowire 22, and the second electrode 18 may be provided over the volume of variable resistance material 20, using methods previously described in relation to FIG. 2I.

Figure 4A:
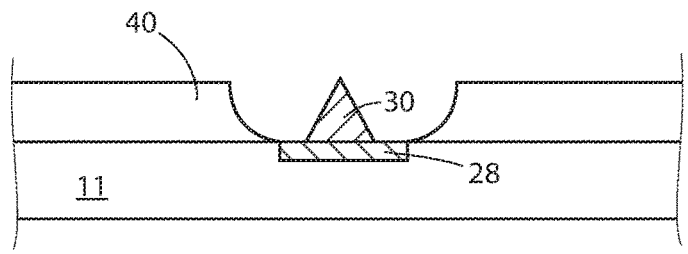
FIGS. 4A-4D are partial cross-sectional side views of a workpiece and illustrate a third embodiment of a method of the present invention that may be used to form a memory device like that shown in FIG. 1A.
Figure 4B:
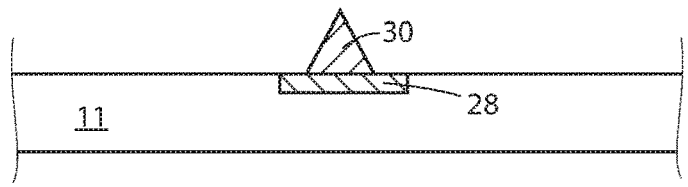
Figure 4C:
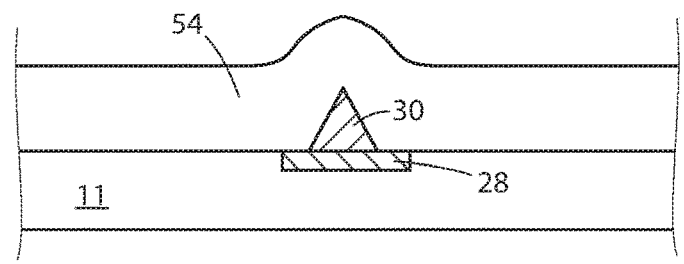
Figure 4D:
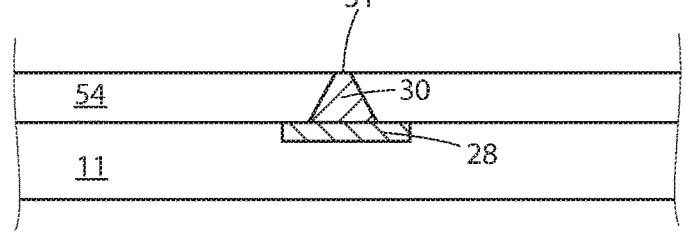

A third embodiment of a method that may be used to form an embodiment of a memory device 10 like that shown in FIG. 1A is described below with reference to FIGS. 4A-4D. Referring to FIG. 4A, a workpiece may be provided that is substantially similar to the workpiece shown in FIG. 2E (using methods previously described in relation to FIGS. 2A-2E) and includes the substrate 11, conductive pad 28, layer of dielectric material 40, and a generally conical catalytic structure 30 on the conductive pad 28. After providing the workpiece shown in FIG. 4A, the remaining portions of the layer of dielectric material 40 may be removed by, for example, using an isotropic wet chemical etching process, to form a structure like that shown in FIG. 4B. Referring to FIG. 4C, a substantially conformal layer of dielectric material 54 then may be deposited over the workpiece. In some embodiments, the substantially conformal layer of dielectric material 54 may have an average thickness greater than the distance by which the catalytic structure 30 extends from the surface of the conductive pad 28 and the substrate 11. A chemical-mechanical polishing (CMP) process then may be used to planarize the layer of dielectric material 54 and expose a selected portion of the tip 31 of the catalytic structure 30 through the dielectric material 54, as shown in FIG. 4D. After forming the structure shown in FIG. 4D, methods like those previously described in relation to FIGS. 2G-2I may be used to complete the formation of the memory cell 12 (FIG. 1A).

Figure 5A:
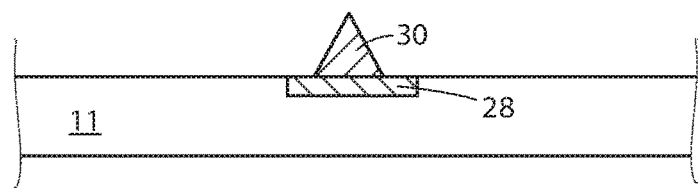
FIGS. 5A-5F are partial cross-sectional side views of a workpiece and illustrate a fourth embodiment of a method of the present invention that may be used to form a memory device like that shown in FIG. 1A.
Figure 5B:
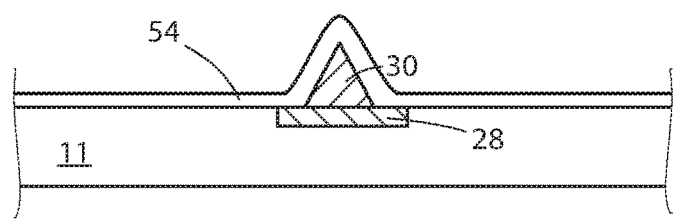

A fourth embodiment of a method that may be used to form a memory device 10 like that shown in FIG. 1A is described below with reference to FIGS. 5A-5F. Referring to FIG. 5A, a workpiece may be provided that is substantially similar to the workpiece shown in FIG. 4B and includes the substrate 11, conductive pad 28, and a generally conical catalytic structure 30 on the conductive pad 28. Referring to FIG. 5B, a substantially conformal layer of dielectric material 54 then may be deposited over the workpiece. The substantially conformal layer of dielectric material 54 may have an average thickness that is less than the distance by which the catalytic structure 30 extends from the surface of the conductive pad 28 and the substrate 11. In some embodiments, the substantially conformal layer of dielectric material 54 may have an average thickness of between about two nanometers (2 nm) and about fifty nanometers (50 nm).

Figure 5C:
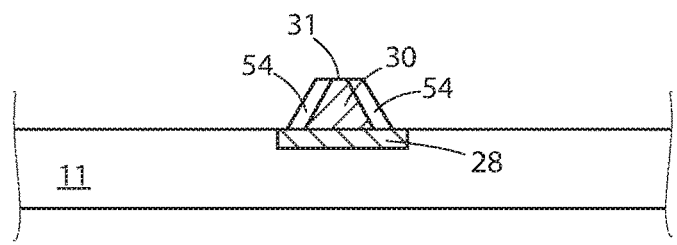

Referring to FIG. 5C, an anisotropic etching process then may be used to remove the generally laterally extending regions of the layer of dielectric material 54, including the regions overlying the substrate 11 and a portion of the layer of dielectric material 54 on the tip 31 of the generally conical catalytic structure 30. After such an anisotropic etching process, only portions of the layer of dielectric material 54 on the lateral sides of the catalytic structure 30 may remain after the anisotropic etching process, and the tip 31 of the catalytic structure 30 may be exposed through the dielectric material 54. The anisotropic etching process may comprise, for example, an anisotropic reactive ion (e.g., plasma) etching process (RIE).

Figure 5D:
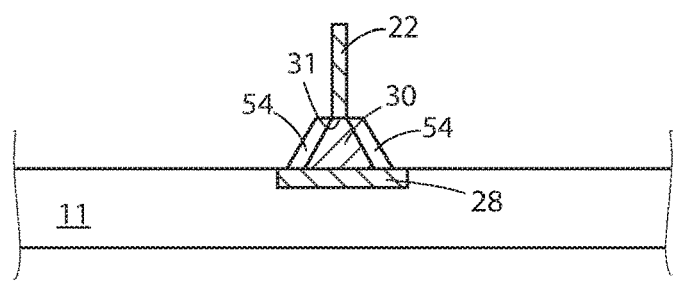
Figure 5E:
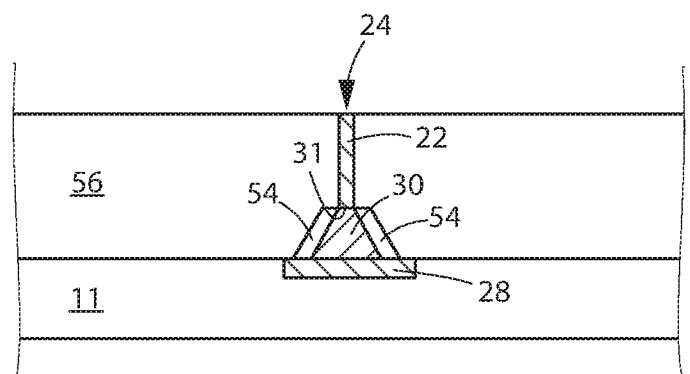
Figure 5F:
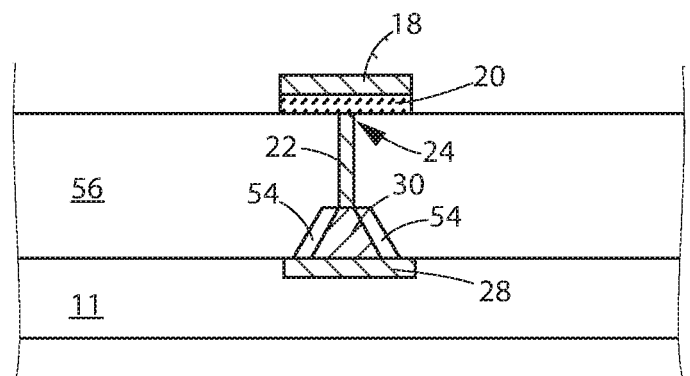

As shown in FIG. 5D, after exposing the tip 31 of the catalytic structure 30 through the dielectric material 54, growth or formation of a single nanowire 22 may be catalyzed using the tip 31 of the catalytic structure 30, as previously described in relation to FIG. 2G. Another layer of dielectric material 56 then may be deposited over the workpiece and around the nanowire 22 and catalytic structure 30. A chemical-mechanical polishing (CMP) process may be used to planarize the surface of the layer of dielectric material 56 and to expose a selected portion of the first end 24 of the nanowire 22 therethrough, as shown in FIG. 5E. As shown in FIG. 5F, a volume of variable resistance material 20 and a second electrode 18 then may be formed on the workpiece over the first end 24 of the nanowire 22 in the manner previously described with reference to FIGS. 2G-2I.

Figure 6A:
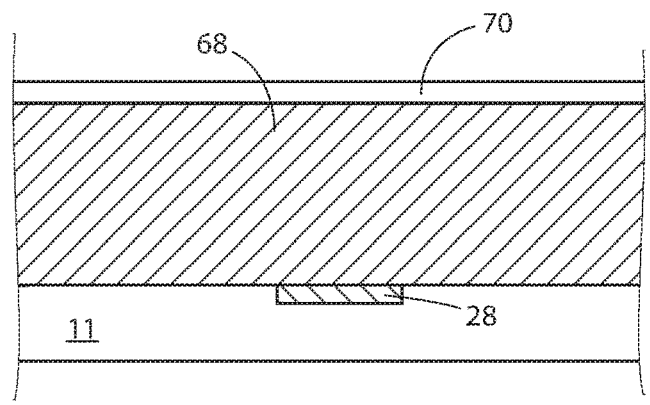
FIGS. 6A-6I are partial cross-sectional side views of a workpiece and illustrate a fifth embodiment of a method of the present invention that may be used to form a memory device like that shown in FIG. 1A.
Figure 6B:
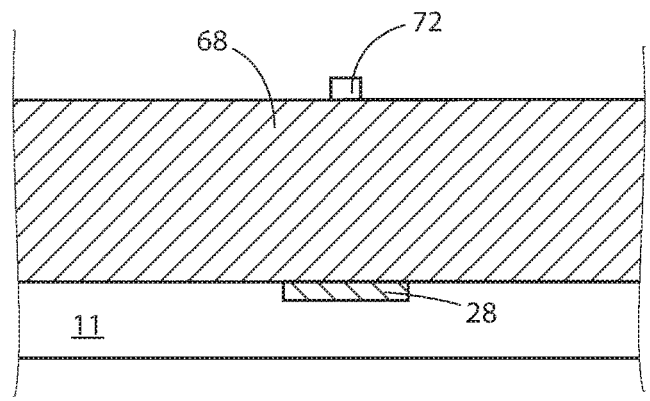

A fifth embodiment of a method that may be used to form an embodiment of a memory device 10 like that shown in FIG. 1A is described below with reference to FIGS. 6A-6I. Referring to FIG. 6A, a workpiece may be provided that includes the substrate 11 and a conductive pad 28. A layer of catalyst material 68 may be deposited over the substrate 11. By way of example and not limitation, the layer of catalyst material 68 may be deposited using a physical vapor deposition (PVD) (e.g., sputtering or thermal evaporation) process, a chemical vapor deposition (CVD) process, an electroless deposition process, or by an electroless deposition to form a seed layer followed by an electroplating process. The layer of catalyst material 68 may have an average thickness of between about fifty nanometers (50 nm) and about five hundred nanometers (500 nm). A mask layer 70 then may be provided over the layer of catalyst material 68. The mask layer 70 may comprise, for example, a layer of photoresist, a layer of nitride material (e.g., $Si_3N_4$), or a layer of oxide material (e.g., $SiO_2$). The mask layer 70 then may be selectively patterned to form a discrete region 72 of mask material, as seen in FIG. 6B, on the surface of the layer of catalyst material 68 overlying the conductive pad 28. By way of example and not limitation, the discrete region 72 of mask material may be generally circular and may have an average diameter of between about twenty nanometers (20 nm) and about one hundred nanometers (100 nm).

Figure 6C:
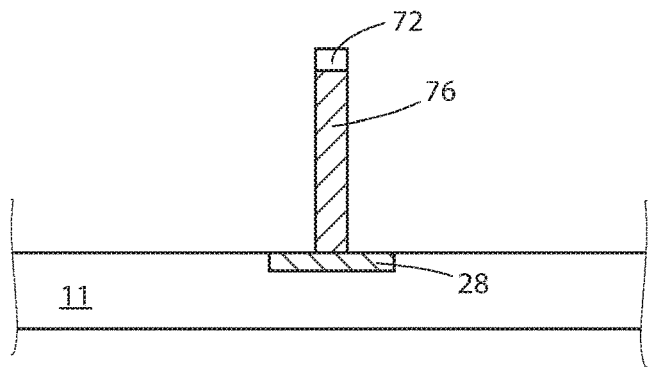

Referring to FIG. 6C, an anisotropic dry reactive ion (i.e., plasma) etching process then may be used to remove the regions of the layer of catalyst material 68 that are not protected by the discrete region 72 of mask material so as to form a catalytic structure 76. In other words, only a portion of the layer of catalyst material 68 vertically under the discrete region 72 of mask material may remain after the anisotropic etching process. As previously discussed, the discrete region 72 of mask material may be, for example, generally circular, and the resulting catalytic structure 76 may be generally cylindrical and may have an average diameter substantially similar to the average diameter of the discrete region 72 of mask material. The discrete region 72 of mask material remaining on the end of the catalytic structure 76 may be removed from the end of the catalytic structure 76 using, for example, a wet chemical etching process.

Figure 6D:
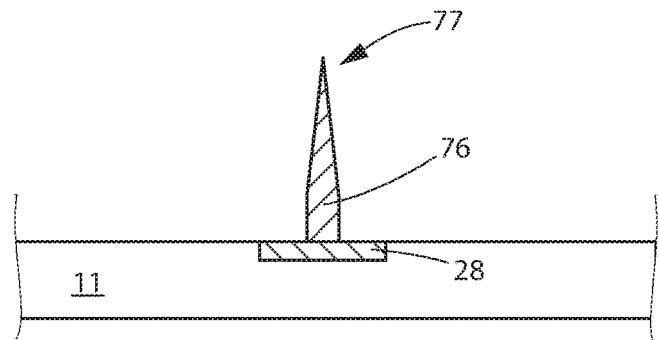

Referring to FIG. 6D, the end 77 of the catalytic structure 76 opposite the conductive pad 28 may be sharpened so as to reduce the cross-sectional area of the catalytic structure 76 near the end 77 thereof. By way of example and not limitation, the end 77 of the catalytic structure 76 may be sharpened using at least one of an anisotropic reactive ion (i.e., plasma) etching process, a sputtering process, and an oxidation process. For example, an anisotropic reactive ion etching process may sharpen the end 77 of the catalytic structure 76 due to an increased rate of etching at the relatively sharp edges near the end 77 of the catalytic structure 76. As another example, the catalytic structure 76 may be sharpened using a sputtering process by bombarding the end 77 of the catalytic structure 76 with ions or other particles (e.g., argon atoms). As yet another example, the catalytic structure 76 may be sharpened using an oxidation process by oxidizing the exterior surfaces of the catalytic structure 76, and subsequently removing the oxide layer formed in the exterior surfaces of the catalytic structure 76.

Figure 6E:
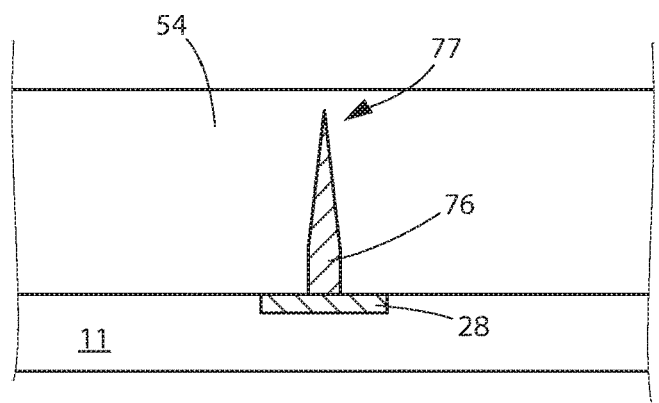

Referring to FIG. 6E, a substantially conformal layer of dielectric material 54 then may be deposited over the workpiece and around the catalytic structure 76. The substantially conformal layer of dielectric material 54 may have an average thickness that is greater than the distance by which the catalytic structure 76 extends from the surface of the conductive pad 28 and the substrate 11. In this configuration, the catalytic structure 76 may be substantially buried within the dielectric material 54.

Figure 6F:
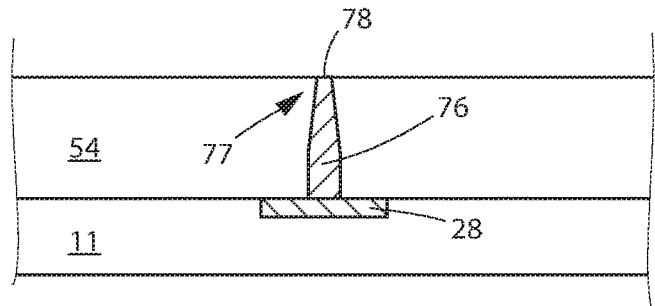
Figure 6G:
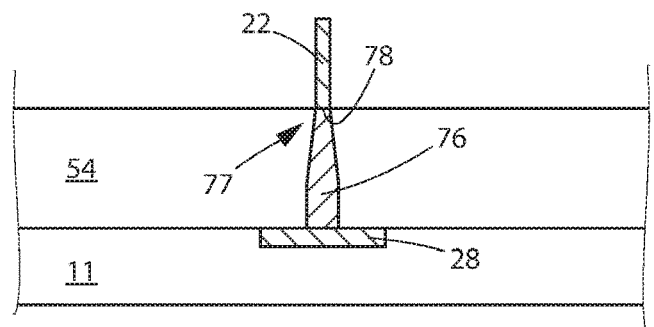

As shown in FIG. 6F, a chemical-mechanical polishing (CMP) process may be used to planarize the surface of the layer of dielectric material 54 and to expose a selected portion of the tip 78 on the end 77 of the catalytic structure 76 therethrough. As shown in FIG. 6G, the exposed tip 78 on the end 77 of the catalytic structure 76 may be used to catalyze formation or growth of a single nanowire 22 thereon as previously described with reference to FIG. 2G.

Figure 6H:
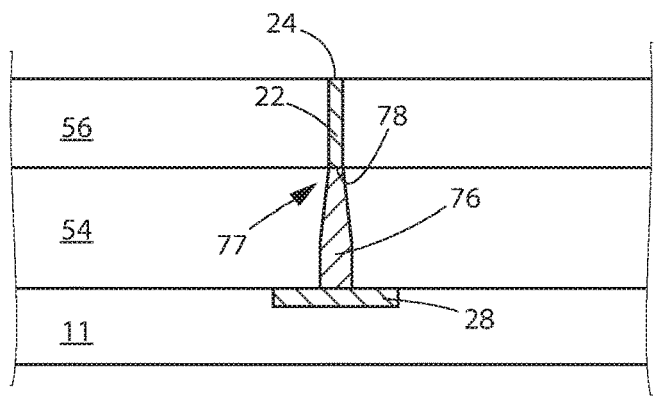
Figure 6I:
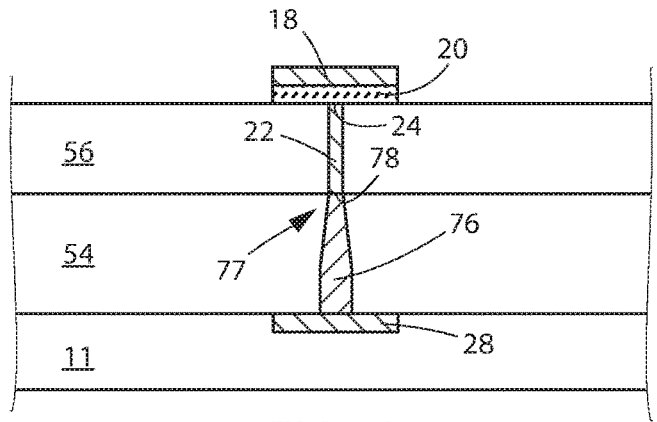

Referring to FIG. 6H, another layer of dielectric material 56 then may be deposited over the workpiece and around the nanowire 22, and a chemical-mechanical polishing (CMP) process may be used to planarize the layer of dielectric material 56 and expose the first end 24 of the nanowire 22 therethrough. As shown in FIG. 6I, a volume of variable resistance material 20 and a second electrode 18 then may be formed on the workpiece over the first end 24 of the nanowire 22 in the manner previously described with reference to FIGS. 2G-2I.

Figure 7A:
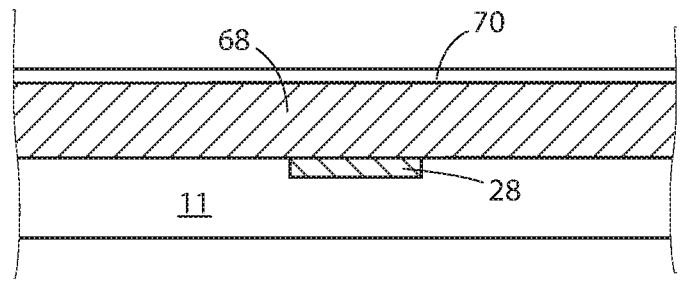
FIGS. 7A-7I are partial cross-sectional side views of a workpiece and illustrate a sixth embodiment of a method of the present invention that may be used to form a memory device like that shown in FIG. 1A.
Figure 7B:
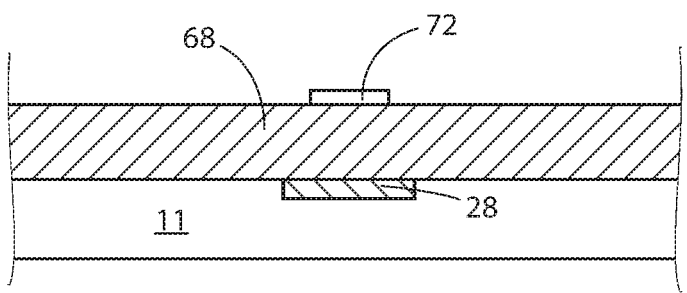

A sixth embodiment of a method that may be used to form a memory device 10 like that shown in FIG. 1A is described below with reference to FIGS. 7A-7I. Referring to FIG. 7A, a workpiece may be provided that includes the substrate 11 and a conductive pad 28. A layer of catalyst material 68 may be deposited over the substrate 11. By way of example and not limitation, the layer of catalyst material 68 may be deposited using a physical vapor deposition (PVD) process (e.g., sputtering or thermal evaporation), a chemical vapor deposition (CVD) process, an electroless deposition process, or by an electroless deposition process used to form a seed layer followed by a subsequent electroplating process. The layer of catalyst material 68 may have an average thickness of between about thirty nanometers (30 nm) and about two hundred nanometers (200 nm). A mask layer 70 then may be provided over the layer of catalyst material 68. The mask layer 70 may comprise, for example, a layer of nitride material (e.g., $Si_3N_4$) or a layer of oxide material (e.g., $SiO_2$). Referring to FIG. 7B, the mask layer 70 then may be selectively patterned to provide a discrete region 72 of mask material on the surface of the layer of catalyst material 68 over the conductive pad 28. By way of example and not limitation, the discrete region 72 of mask material may be generally circular and may have an average diameter of between about thirty nanometers (30 nm) and about one hundred nanometers (100 nm).

Figure 7C:
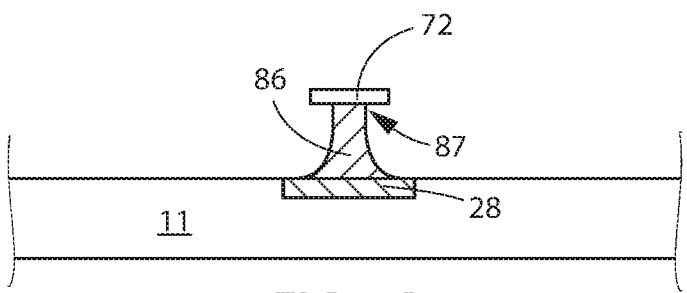

Referring to FIG. 7C, a partially isotropic etching process (e.g., a wet chemical etch or a partially isotropic reactive ion etch (RIE)) then may be used to remove the regions of the layer of catalyst material 68 that are not covered or otherwise protected by the discrete region 72 of mask material so as to form a catalytic structure 86. In other words, only a portion of the layer of catalyst material 68, vertically under the discrete region 72 of mask material, may remain after the partially isotropic etching process. The partially isotropic etching process may result in undercutting of the layer of catalyst material 68 below the discrete region 72 of mask material, and the lateral sidewalls of the remaining catalyst material 68 may have a generally curved frustoconical shape, as opposed to being substantially vertical, as shown in FIG. 7C. As previously discussed, the discrete region 72 of mask material may be generally circular, and the resulting catalytic structure 86 may have a generally frustoconical shape similar to a portion of a cone. The upper end 87 of the catalytic structure 86 may have a substantially circular cross-sectional shape having an average diameter less than the average diameter of the discrete region 72 of mask material.

Figure 7D:
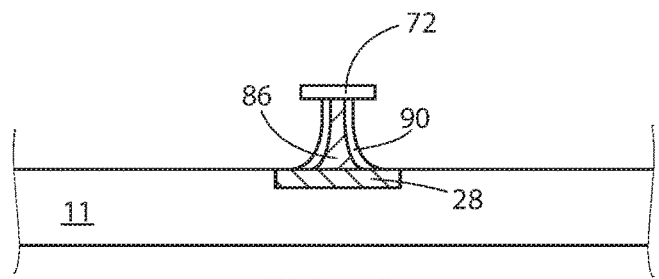

As shown in FIG. 7D, optionally, the exterior surfaces of the catalytic structure 86 may be oxidized to form an oxidation layer 90 therein, which may effectively reduce the cross-sectional area of the catalytic structure 86. The exterior surfaces of the catalytic structure 86 may be oxidized to form the oxidation layer 90 by, for example, heating the workpiece in an oxidizing atmosphere. By selectively controlling the oxidation process so as to oxidize the exterior surfaces of the catalytic structure 86 to a predetermined depth and, hence, provide a predetermined thickness of the oxidation layer 90, a selected effective cross-sectional area of the catalytic structure 86 may be provided, which is less than the original cross-sectional area of the catalytic structure 86. Furthermore, the effective cross-sectional area of the catalytic structure 86 may be selected so as to facilitate growth of a single nanowire 22 thereon.

Figure 7E:
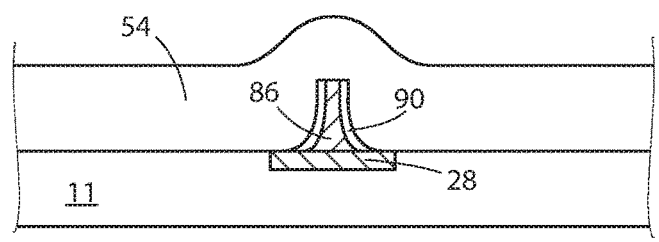

Referring to FIG. 7E, the discrete region 72 of mask material remaining on the end 87 of the catalytic structure 86 may be removed from the end 87 of the catalytic structure 86 using, for example, a wet chemical etching process. A substantially conformal layer of dielectric material 54 then may be deposited over the workpiece and around the catalytic structure 86. The layer of dielectric material 54 may have an average thickness that is greater than a distance by which the catalytic structure 86 extends from the surface of the conductive pad 28 and the substrate 11, as shown in FIG. 7E.

Figure 7F:
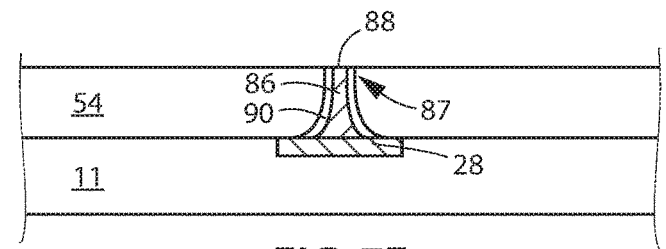
Figure 7G:
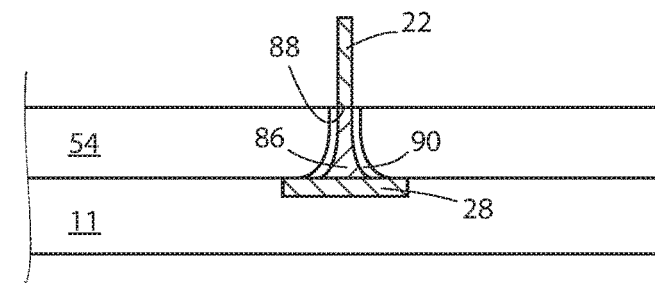

As shown in FIG. 7F, a chemical-mechanical polishing (CMP) process may be used to planarize the surface of the layer of dielectric material 54 and to expose a selected portion of the tip 88 on the end 87 of the catalytic structure 86 therethrough. As shown in FIG. 7G, the exposed tip 88 on the end 87 of the catalytic structure 86 may be used to catalyze formation or growth of a single nanowire 22 thereon, as previously described with reference to FIG. 2G.

Figure 7H:
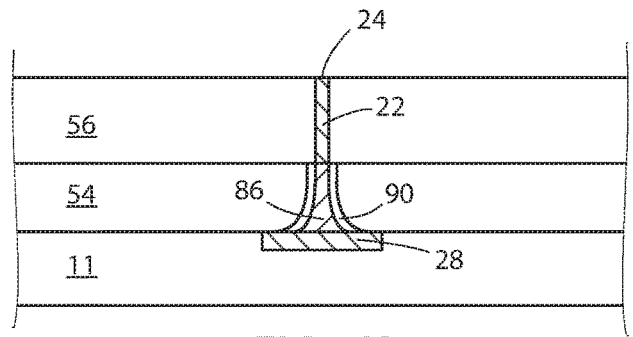
Figure 7I:
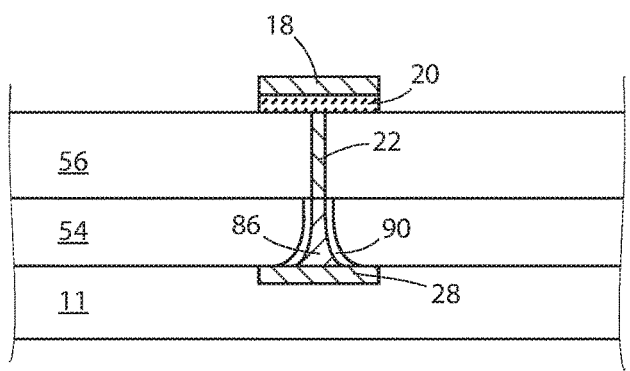

Referring to FIG. 7H, another layer of dielectric material 56 may be deposited over the workpiece and around the nanowire 22, and a chemical-mechanical polishing (CMP) process may be used to planarize the layer of dielectric material 56 and expose the first end 24 of the nanowire 22 therethrough. As shown in FIG. 7I, a volume of variable resistance material 20 and a second electrode 18 then may be formed on the workpiece over the first end 24 of the nanowire 22 in the manner previously described with reference to FIGS. 2G-2I.

Figure 8A:
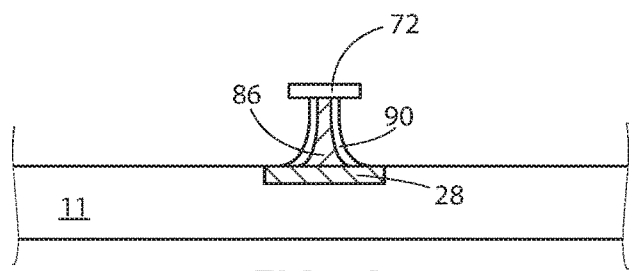
FIGS. 8A-8E are partial cross-sectional side views of a workpiece and illustrate a seventh embodiment of a method of the present invention that may be used to form a memory device like that shown in FIG. 1A.

A seventh embodiment of a method that may be used to form a memory device 10 like that shown in FIG. 1A is described below with reference to FIGS. 8A-8E. Referring to FIG. 8A, a workpiece may be provided that is substantially similar to that shown in FIG. 7D and includes a catalytic structure 86 having an oxidation layer 90 therein to effectively reduce the cross-sectional area of the catalytic structure 86. A discrete region 72 of mask material may remain over the catalytic structure 86 as previously described.

Figure 8B:
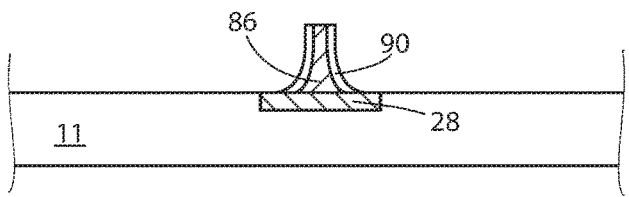
Figure 8C:
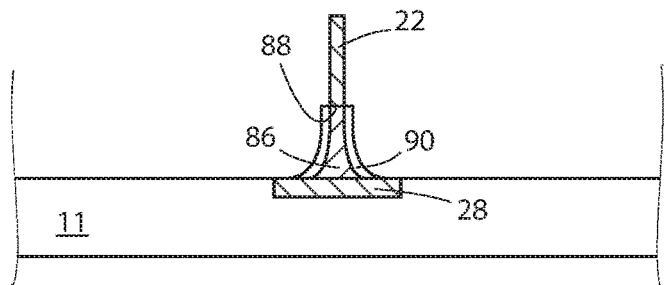

Referring to FIG. 8B, the discrete region 72 of mask material remaining on the end 87 of the catalytic structure 86 may be removed from the end of the catalytic structure 86 using, for example, a wet chemical etching process. As shown in FIG. 8C, the exposed tip 88 on the end 87 of the catalytic structure 86 then may be used to catalyze formation or growth of a single nanowire 22 thereon, as previously described with reference to FIG. 2G.

Figure 8D:
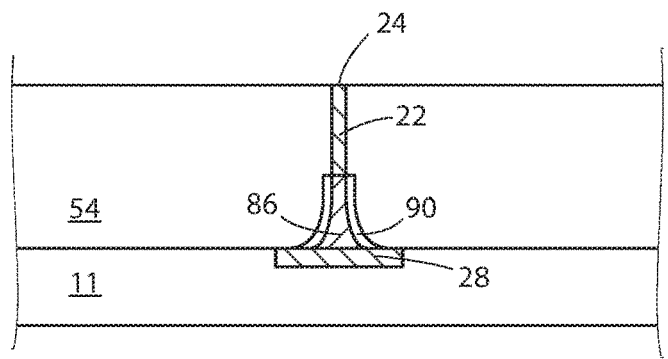

Referring to FIG. 8D, a substantially conformal layer of dielectric material 54 then may be deposited over the workpiece and around the catalytic structure 86 and the nanowire 22. The layer of dielectric material 54 may have an average thickness that is greater than a distance by which the catalytic structure 86 and the nanowire 22 extend from the surface of the conductive pad 28 and the substrate 11. A chemical-mechanical polishing (CMP) process may be used to planarize the surface of the layer of dielectric material 54 and to expose the first end 24 of the nanowire 22 therethrough.

Figure 8E:
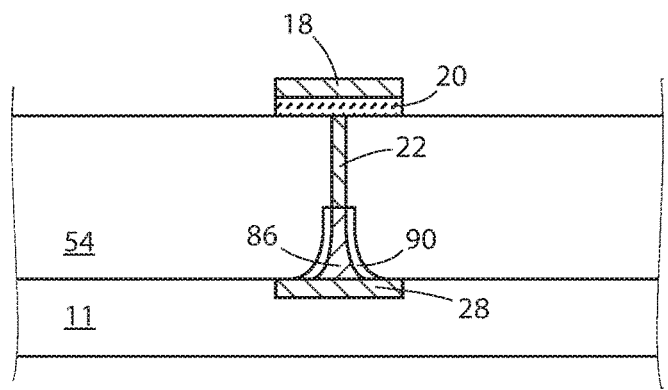

As shown in FIG. 8E, a volume of variable resistance material 20 and a second electrode 18 then may be formed on the workpiece over the first end 24 (FIG. 8D) of the nanowire 22 in the manner previously described with reference to FIGS. 2G-2I.

Figure 9:
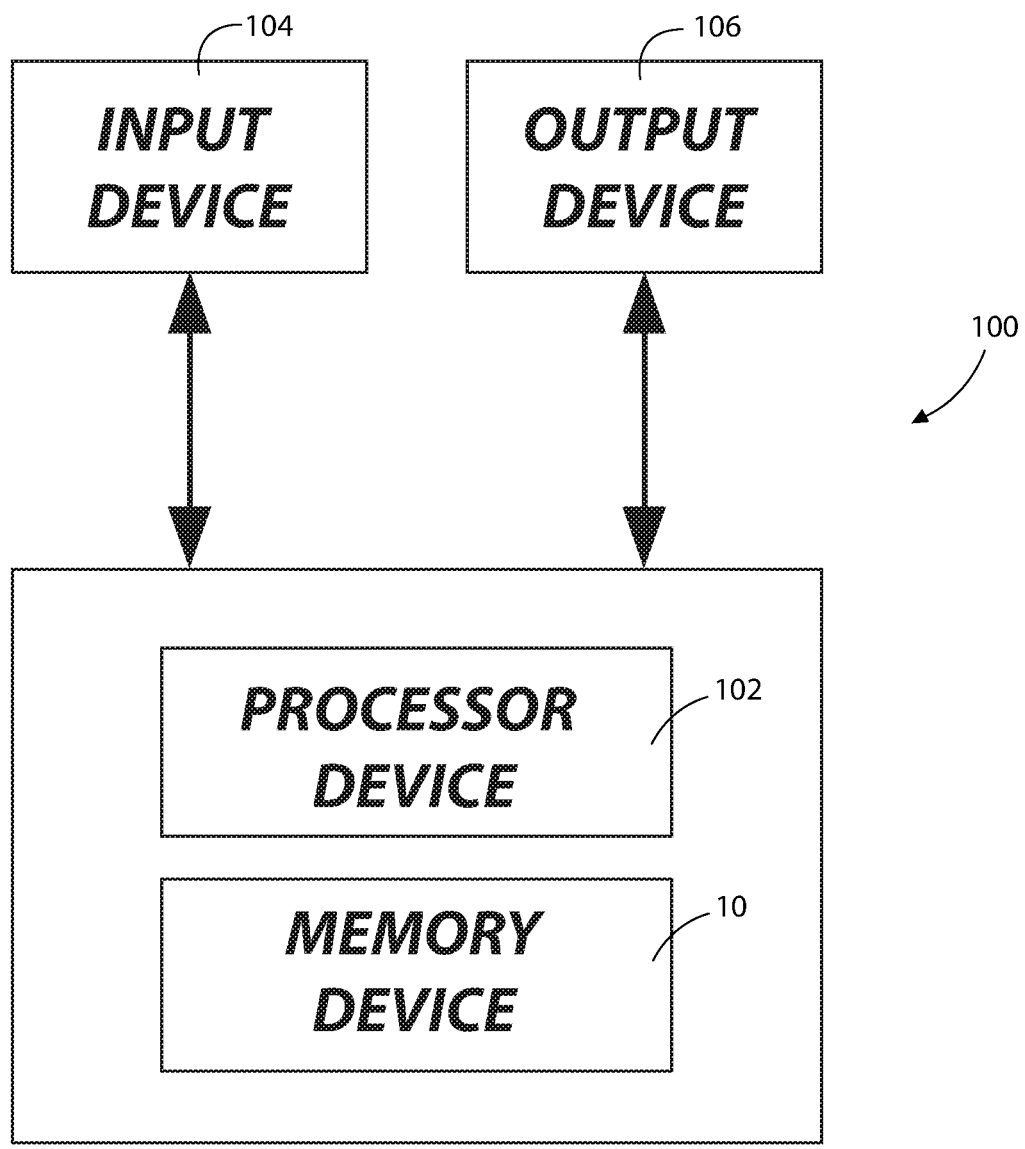
FIG. 9 is a schematic block diagram illustrating one embodiment of an electronic system of the present invention that includes a memory device as shown in FIG. 1A.

Memory devices like that shown in FIG. 1A may be used in embodiments of electronic systems of the present invention. For example, FIG. 9 is a block diagram of an illustrative electronic system 100 according to the present invention. The electronic system 100 may comprise, for example, a computer or computer hardware component, a server or other networking hardware component, a cellular telephone, a digital camera, a personal digital assistant (PDAs), portable media (e.g., music) player, etc. The electronic system 100 includes at least one memory device of the present invention, such as the embodiment of the memory device 10 shown in FIG. 1A. The electronic system 100 further may include at least one electronic signal processor device 102 (often referred to as a "microprocessor"). The electronic system 100 may, optionally, further include one or more input devices 104 for inputting information into the electronic system 100 by a user, such as, for example, a mouse or other pointing device, a keyboard, a touchpad, a button, or a control panel. The electronic system 100 may further include one or more output devices 106 for outputting information (e.g., visual or audio output) to a user such as, for example, a monitor, display, printer, speaker, etc. The one or more input devices 104 and output devices 106 may communicate electrically with at least one of the memory device 10 and the electronic signal processor device 102.

While the present invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from the spirit and scope of the invention as defined by the claims that follow.

What is claimed is:

1. An apparatus, comprising:
an array of memory devices, at least one memory device of the array comprising:
a conductive pad;
a generally conical structure having a tip and a base coupled to the conductive pad; and
a single nanowire extending from the tip of the generally conical structure, wherein an effective cross-sectional area of the tip of the generally conical structure is sized to facilitate formation of only the single nanowire thereon; and
at least one conductive line connecting memory devices of the array including the at least one memory device of the array.

2. The apparatus of claim 1, wherein the at least one memory device comprises a volume of variable resistance material located between the single nanowire and the at least one conductive line.

3. The apparatus of claim 2, wherein the at least one memory device comprises an electrode located between the volume of variable resistance material and the at least one conductive line.

4. The apparatus of claim 1, wherein the at least one memory device comprises a dielectric material laterally adjacent the generally conical structure.

5. An electronic system comprising:
at least one processor;
at least one memory device in electrical communication with the at least one processor, the at least one memory device comprising:
a conductive pad;
a generally conical structure coupled to the conductive pad; and
a single nanowire extending from an end of the generally conical structure opposite the conductive pad, wherein the end of the generally conical structure is sized to facilitate formation of only the single nanowire thereon; and
at least one of an input device and an output device in electrical communication with the at least one processor.

6. The electronic system of claim 5, wherein the single nanowire comprises at least one of a hollow nanotube or a substantially solid nanowire.

7. The electronic system of claim 5, wherein the at least one memory device comprises a volume of variable resistance material in contact with an end of the single nanowire opposite the generally conical structure.

8. The electronic system of claim 7, wherein the volume of variable resistance material comprises a phase change material.

9. The electronic system of claim 7, wherein the at least one memory device comprises an electrode connected to the volume of variable resistance material on a side of the volume of variable resistance material opposite the single nanowire.

10. The electronic system of claim 9, further comprising:
a first conductive line in electrical communication with the electrode through an electrical contact; and
a second conductive line in electrical communication with the conductive pad through another electrical contact.

11. The electronic system of claim 9, wherein an average thickness of the volume of variable resistance material between the single nanowire and the electrode is about twice an average diameter of the single nanowire.

12. The apparatus of claim 2, wherein the single nanowire is in direct physical contact with each of the generally conical structure and the volume of variable resistance material, the single nanowire being configured to provide electrical contact between the conductive pad and the volume of variable resistance material.

13. The apparatus of claim 1, wherein the single nanowire comprises an integrated PN junction or a superlattice structure.

14. The apparatus of claim 1, wherein a cross-sectional area of the tip of the generally conical structure is less than a cross-sectional area of the base of the generally conical structure.

15. The apparatus of claim 1, wherein the generally conical structure comprises a catalyst material configured to catalyze formation or growth of the single nanowire thereon.

16. The apparatus of claim 1, wherein the at least one conductive line comprises a first elongated laterally extending conductive trace extending in a first horizontal direction and a second elongated laterally extending conductive trace extending in a second horizontal direction, generally transverse to the first horizontal direction.

17. The electronic system of claim 7, wherein the single nanowire is located and configured to provide a sole, low-resistance electrical pathway between the conductive pad and the volume of variable resistance material.

18. The electronic system of claim 7, wherein the volume of variable resistance material is configured to exhibit a first state having a first resistivity and a second state having a second resistivity, different than the first resistivity of the first state.

19. The electronic system of claim 9, wherein the at least one memory device comprises another electrode comprising the conductive pad, the generally conical structure, and the single nanowire, the memory device being configured to allow current to flow between the electrode and the other electrode in response to a voltage applied therebetween.

20. The electronic system of claim 19, wherein a cross-sectional area of the electrode in contact with the volume of variable resistance material is greater than a cross-sectional area of the other electrode in contact with the volume of variable resistance material.

* * * * *